US012604700B2

(12) United States Patent　　　　(10) Patent No.:　US 12,604,700 B2
Stupan et al.　　　　　　　　　　　(45) Date of Patent:　　Apr. 14, 2026

---

(54) VACUUM TREATMENT APPARATUS AND METHODS FOR MANUFACTURING VACUUM TREATED SUBSTRATES

(71) Applicant: EVATEC AG, Trübbach (CH)

(72) Inventors: Marco Stupan, Ruggell (LI); Lukas Epprecht, Klingnau (CH); Alexander Gabathuler, Azmoos (CH); Stefan Huggenberger, Riniken (CH); Benjamin Müller, Zürich (CH)

(73) Assignee: EVATEC AG, Trübbach (CH)

( * ) Notice: Subject to any disclaimer, the term of this patent is extended or adjusted under 35 U.S.C. 154(b) by 366 days.

(21) Appl. No.: 18/547,234

(22) PCT Filed: Feb. 2, 2022

(86) PCT No.: PCT/EP2022/052414

§ 371 (c)(1),
(2) Date: Aug. 21, 2023

(87) PCT Pub. No.: WO2022/175083

PCT Pub. Date: Aug. 25, 2022

(65) Prior Publication Data

US 2024/0128099 A1　　Apr. 18, 2024

(30) Foreign Application Priority Data

Feb. 22, 2021　(CH) ..................................... 00182/21

(51) Int. Cl.
H01L 21/67　　　(2006.01)
H01L 21/677　　(2006.01)
(Continued)

(52) U.S. Cl.
CPC .. H01L 21/67207 (2013.01); H01L 21/67742 (2013.01); H01L 21/6838 (2013.01); H01L 21/68742 (2013.01)

(58) Field of Classification Search
CPC ......... H01L 21/67742; H01L 21/67745; H01L 21/67754
See application file for complete search history.

(56) References Cited

U.S. PATENT DOCUMENTS 6,012,966 A * 1/2000 Ban ......................... B24B 49/00
　　　　　　　　　　　　　　　　451/287
6,224,312 B1 * 5/2001 Sundar ................ H01L 21/6719
　　　　　　　　　　　　　　　　414/217

(Continued)

FOREIGN PATENT DOCUMENTS

DE　　10 2010 016792 A1　　11/2011

OTHER PUBLICATIONS

International Search Report and Written Opinion for PCT/EP2022/052414 dated Jun. 3, 2022.

*Primary Examiner* — Jason L Vaughan
(74) *Attorney, Agent, or Firm* — McDonald Hopkins LLC

(57)　　　　　　ABSTRACT

The substrates supported in substrate holders are carried on holder carriers in a manner, that their extended surfaces are exposed to the surrounding atmosphere along an extended surface of the holder carriers. The holder carriers include an axis traverse to their extended surface. The substrates on a holder carrier are vacuum treated in a vacuum treatment chamber. This chamber communicates via a gate valve with a transfer vacuum chamber. A holder carrier with substrates in the vacuum treatment chamber is exchanged with a holder carrier carrying untreated substrates from the transfer vacuum chamber 23 by means of an exchange robot. During treatment in the vacuum treatment chamber, holder carriers with treated substrates and holder carriers with untreated substrates are exchanged in the transfer vacuum chamber through a gate valve. The transfer vacuum chamber acts as a load-lock.

24 Claims, 18 Drawing Sheets

(51) Int. Cl.
    *H01L 21/683*          (2006.01)
    *H01L 21/687*          (2006.01)

(56)                     References Cited

U.S. PATENT DOCUMENTS

| | | | |
|---|---|---|---|
| 7,010,388 B2 * | 3/2006 | Mitchell | H01L 21/67745 |
| | | | 700/218 |
| 9,230,842 B2 * | 1/2016 | Kobayashi | H01L 21/67184 |
| 9,305,814 B2 * | 4/2016 | Numakura | H01L 21/67253 |
| 10,086,511 B2 * | 10/2018 | Van Der Meulen | |
| | | | H01L 21/67754 |
| 10,290,523 B2 * | 5/2019 | Nozawa | H01L 21/68 |
| 10,403,525 B2 * | 9/2019 | Nishino | G05B 19/41865 |
| 10,685,832 B1 | 6/2020 | Inada et al. | |
| 11,049,740 B1 * | 6/2021 | Rice | H01L 21/68707 |
| 11,086,286 B2 * | 8/2021 | Hirata | H01L 21/67745 |
| 11,759,954 B2 * | 9/2023 | Bergantz | B25J 9/1692 |
| | | | 700/254 |
| 2001/0051081 A1 | 12/2001 | Wagner et al. | |
| 2004/0240971 A1 | 12/2004 | Tezuka et al. | |
| 2006/0087638 A1 * | 4/2006 | Hirayanagi | B82Y 40/00 |
| | | | 355/75 |
| 2010/0329827 A1 | 12/2010 | Hoey et al. | |
| 2011/0135427 A1 * | 6/2011 | Sakaue | H01L 21/67745 |
| | | | 414/217 |
| 2013/0078823 A1 * | 3/2013 | Takeshima | C23C 16/4408 |
| | | | 257/E21.328 |
| 2013/0243550 A1 * | 9/2013 | Yasui | H01L 21/67745 |
| | | | 414/217 |
| 2014/0234057 A1 | 8/2014 | Newman | |
| 2020/0395232 A1 | 12/2020 | Krupyshev et al. | |
| 2021/0159111 A1 * | 5/2021 | Prengle | H01L 21/67115 |

* cited by examiner

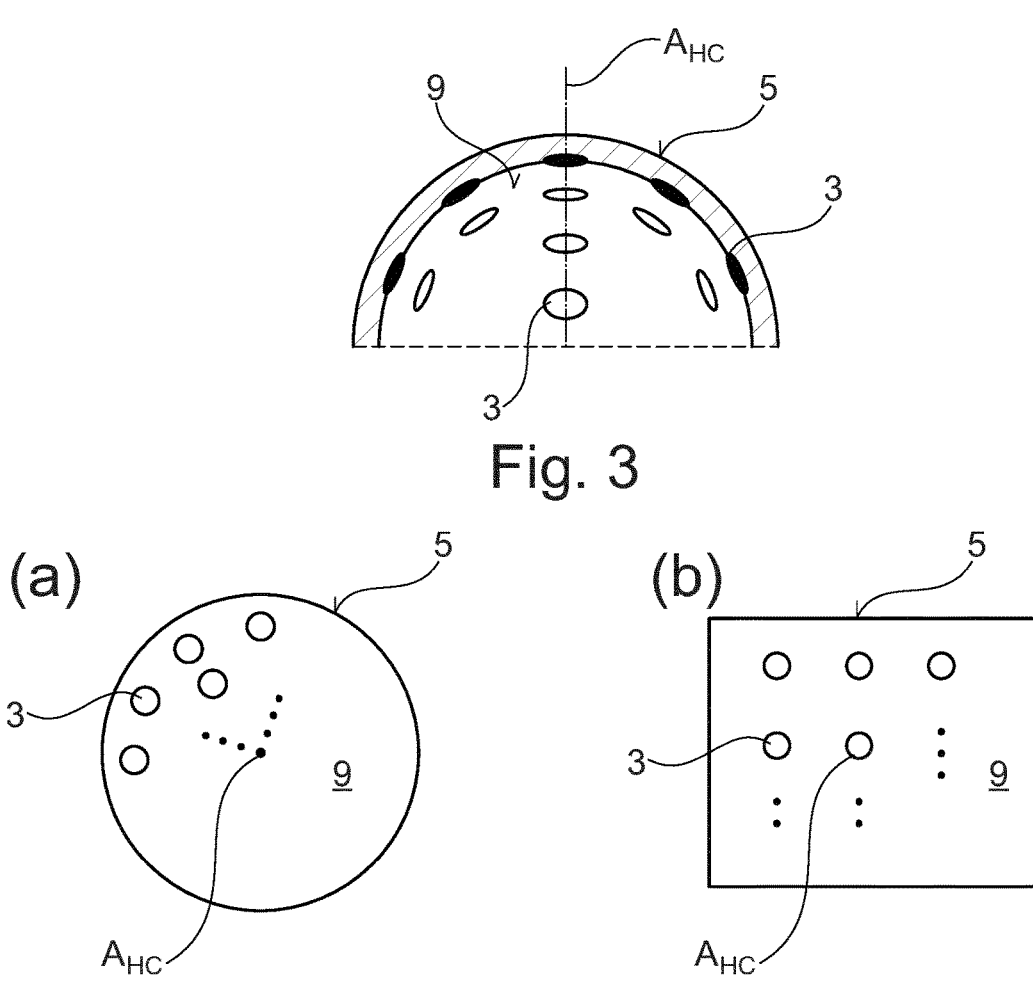
Fig. 3
(a)        (b)
Fig. 4
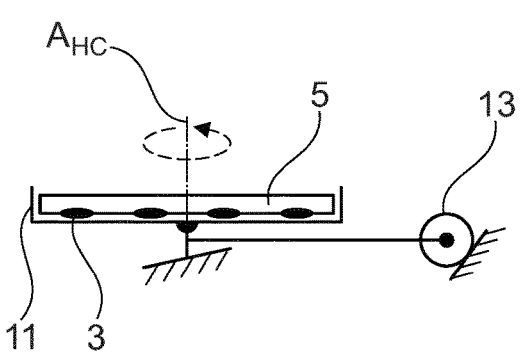
Fig. 5
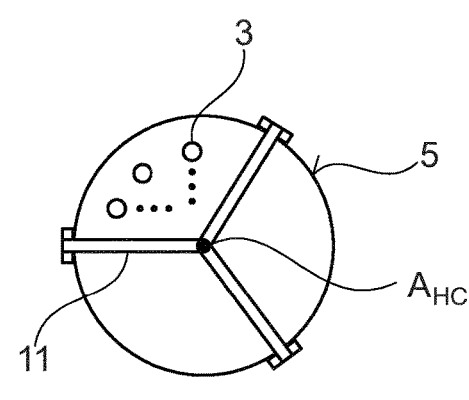
Fig. 6

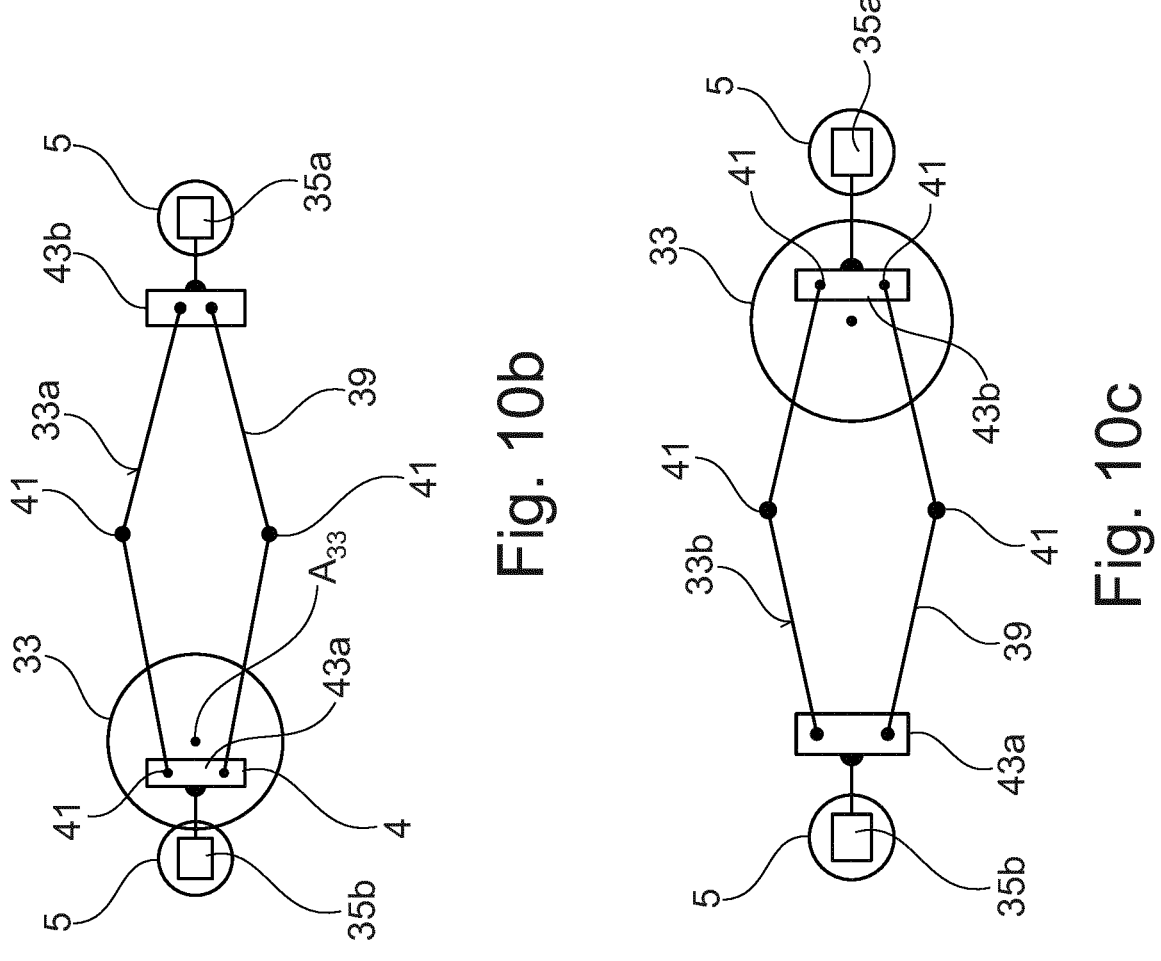
Fig. 10b
Fig. 10c
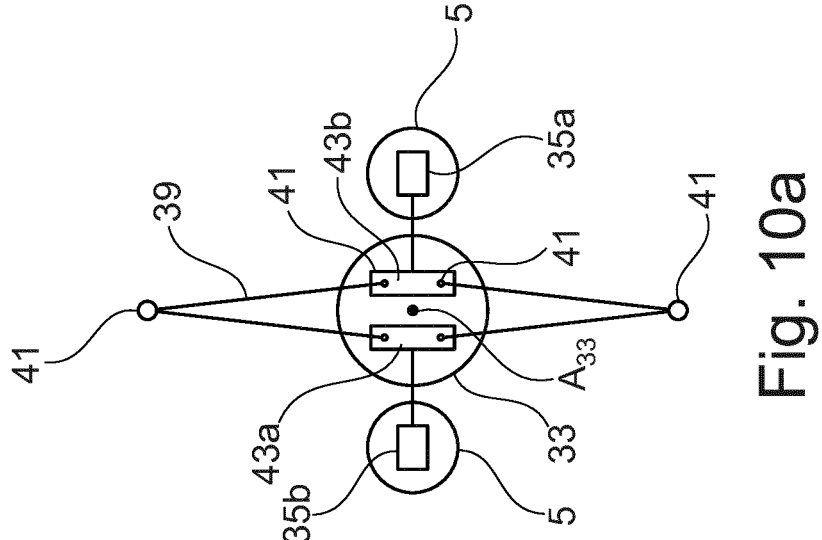
Fig. 10a (a)

(b)

VACUUM TREATMENT APPARATUS AND METHODS FOR MANUFACTURING VACUUM TREATED SUBSTRATES

The present invention departs from the need of improving the throughput of treated substrates when vacuum treating batches of substrates by evaporation. Nevertheless, the inventively found solution by the inventors may be generically applied in vacuum treatment techniques in which all the following definitions are fulfilled which definitions shall be explained with the help of the FIGS. 1 to 6.

Figure 1:
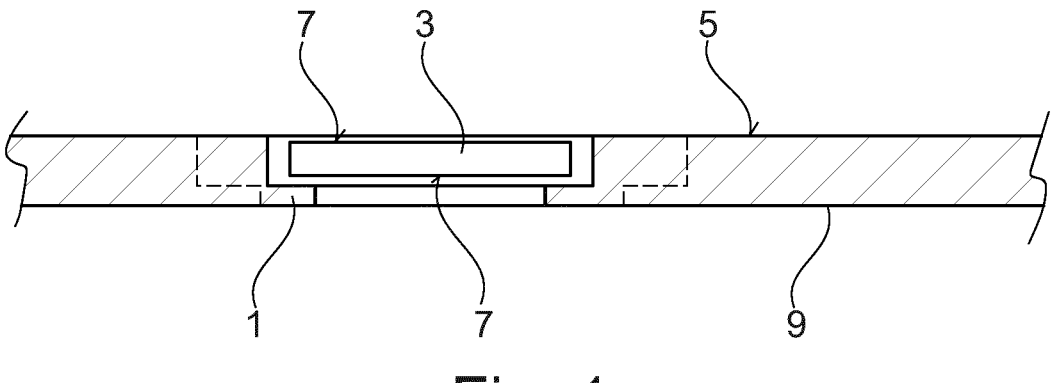

Definitions i) A substrate holder SH is a device or a part of a device by or in which a substrate is held on a holder carrier HC. Thereby one extended surface of a substrate held in a SH is freely exposed to the surrounding atmosphere, possibly with the exception of members which overlap the addressed freely exposed surface for holding a substrate. FIG. 1 shows schematically an example of a SH 1 holding a substrate 3 on a HC 5. The SH may be an integral part of the HC 5 or, as shown in dash lines, a distinct part held in the HC. In this example both extended Surfaces 7 of the substrate 3 are freely exposed to the surrounding atmosphere.

Figure 2:
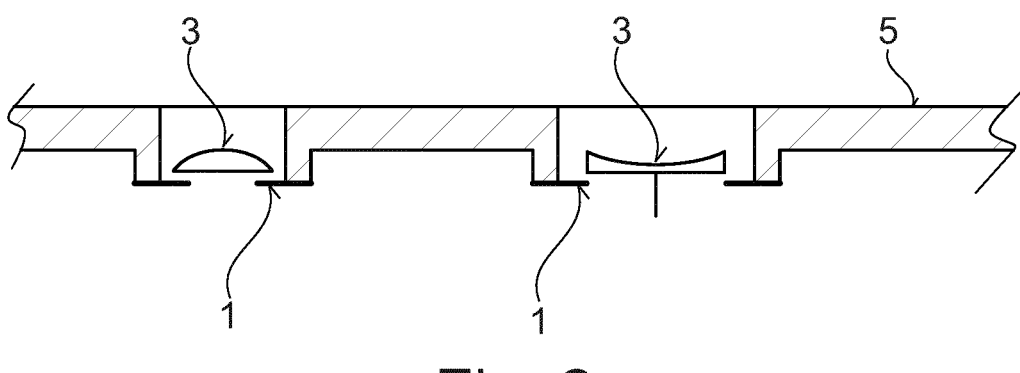

The substrates 3 may have an extended surface 7 which is, in cross-sectional view, plane, concavely or convexly bent and combinations thereof. In top view the substrates 3 may have any desired shape e.g. circular, elliptical, rectangular, square, may e.g. be a wafer, an optical glass or lens etc.

ii) A holder carrier HC 5 is thus a device which holds at least one SH 1 or to which at least one SH 1 is integrated. Just one or two SH1 is or are on the HC 5 especially if the substrates to be treated are large. Otherwise, a multitude of SH1 are provided along the extent of HC 5. FIG. 2 shows schematically an example of a HC 5. A HC 5 may thereby, in a cross-sectional view, have an extended surface 9 along which the extended surfaces 7 of the substrates 3 are freely exposed to the surrounding, which is plane, convex or concave. In the example shown in FIG. 3, showing a calotte shaped HC 5, the addressed surface 9 is concave. In top view the HC 5 may be circular as shown in FIG. 4a, square or rectangular as shown in FIG. 4b.

iii) The HC 5 have a center axis $A_{HC}$ which is traverse to the extended surface 9, along which the extended surfaces 7 of the substrates are freely exposed to the surrounding.

iv) A holder carrier-HC-support, HCS 11, is a device, which holds a HC 5 in a position, and, in some embodiments, rotates the HC 5 around the center axis $A_{HC}$ as by a drive 13, shown in FIG. 5 in dash line.

In FIGS. 5 and 6 a circular, plate shaped HC 5 is schematically shown. In the FIGS. 3 to 6 the SH 1 are not shown.

At least one or two or a multitude i.e. a batch of substrates is or are handled in the vacuum treatment apparatus which fulfills the address definitions.

So as to address the need of improving the substrate throughput of a vacuum treatment apparatus or of a method of manufacturing vacuum treated substrates whereat the addressed definitions i) to iv) are fulfilled, there is proposed a vacuum treatment apparatus comprising:

At least one substrate holder located along an extended surface of at least one holder carrier, the substrate holder being configured to hold an extended surface of a substrate resting therein to be freely exposed to the surrounding along the extended surface of the holder carrier. The extended surface of the holder carrier extends around a central axis of the holder carrier, which axis is directed traverse to the extended surface of the holder carrier (5);

At least one vacuum treatment chamber communicating via one first gate valve with a transfer vacuum chamber;

said vacuum treatment chamber comprising a first holder carrier support configured to support one holder carrier;

the transfer vacuum chamber comprising:

a pumping port;

a second holder carrier support configured to support one holder carrier;

an exchange conveyer between the first gate valve and the second holder carrier support, configured to grasp and release a holder carrier from and, respectively, on the first holder carrier support, through the first gate valve, and to grasp and release a holder carrier from and, respectively, on the second holder carrier support;

at least one second gate valve communicating towards ambient atmosphere;

a further conveyer configured to convey a holder carrier through the at least one second gate valve from and/or onto the second holder carrier support ($11_{LL}$).

Because the transfer vacuum chamber communicates with the vacuum treatment chamber by the first gate valve, comprises a pumping port and the at least one second gate valve it has the structure of a load lock chamber. This allows unloading of a holder carrier through the at least one second gate valve and loading of a holder carrier through the at least one second gate valve during time spans in which the first gate valve is closed and thus during treatment operation of the vacuum treatment chamber on the substrates on a holder carrier in the treatment chamber. Further, the treatment atmosphere in the treatment chamber is not interrupted when a holder carrier with untreated substrates in the transfer vacuum chamber is exchanged with a holder carrier with treated substrates in the vacuum treatment chamber and is thus continuously maintained. This significantly contributes to a high throughput of treated substrates.

In one embodiment of the apparatus according to the invention the distinct holder carrier comprises at least two distinct segments. The exchange conveyer is configured to grasp and release one of the distinct segments at a time from and, respectively, on the first holder carrier support and to grasp and release one of the distinct segments at a time from and, respectively, on the second holder carrier support ($11_{LL}$).

Thus, the exchange conveyer handles one of the segments after the other up to complete handling of the respective complete distinct holder carrier. Thereby the extent of the first gate valve is significantly reduced compared with such extent for exchange-handling of the complete holder carrier at a time, the weight of the parts simultaneously handled by the exchange conveyer is significantly reduced and nevertheless large holder carriers are treated in the vacuum treatment chamber.

According to one embodiment of the apparatus according to the invention, the first holder carrier support comprises a frame supporting structure for the distinct segments.

Thus, the addressed segments of the holder carrier are piece by piece deposited in and, respectively, removed from the first holder carrier support which, due to its frame structure, does not bar the free exposure of the substrates on the substrate holders to the vacuum treatment in the vacuum treatment chamber. Clearly also the second holder carrier support may comprise a frame supporting structure for the distinct segments, even the same structure as the first holder carrier support, to simplify segment handling of the exchange conveyer.

In one embodiment of the apparatus according to the invention, the extended surface of holder carrier is one of plane, convex or concave.

In one embodiment of the apparatus according to the invention, the extended surface of the holder carrier is concave and calotte-shaped.

In one embodiment of the apparatus according to the invention, the extended surface of the holder carrier is concave or convex and formed by plane sectors of plane surfaces.

In one embodiment of the apparatus according to the invention, the first holder carrier support is controllably rotatable around the support central axis.

Rotation of the first holder carrier support as addressed is performed for homogenizing the treatment effect on all the substrates on the holder carrier applied on the first holder carrier support.

In an embodiment of the apparatus according to the invention, wherein the distinct holder carrier comprises at least two distinct segments and said exchange conveyer is configured to grasp and release one of said distinct segments at a time from and, respectively, on said first holder carrier support and to grasp and release one of said distinct segments at a time from and, respectively, on said second holder carrier support said first and said second holder carrier supports are rotatable around a respective holder central axis in angular steps by at least one step drive.

In one embodiment of the apparatus according to the invention, each of the first and of the second holder carrier supports has a holder central axis ($A_{11TR}$, $A_{11LL}$) and these holder central axes are mutually parallel.

In one embodiment of the just addressed embodiment of the apparatus according to the invention, the central axis of one of the holder carrier on the first holder carrier support and the central axis of one of the holder carrier on the second holder carrier support coincide, respectively, with the support central axes.

In one embodiment of the apparatus according to the invention the central axis of one of the holder carrier on the first holder carrier support and the central axis ($A_{HC}$) of one of the holder carrier (5) on the second holder carrier support are mutually parallel.

In one embodiment of the just addressed embodiment of the apparatus according to the invention, the central axes are vertical.

In one embodiment of the apparatus according to the invention the exchange conveyer is configured to convey the holder carrier perpendicularly to the central axes of the holder carriers on the first and on the second holder carrier supports.

In one embodiment of the apparatus according to the invention the exchange conveyer comprises at least two extendable and retractable grasping arms (33a,33b), expandable and retractable relative to a rotation axis of the exchange conveyer and commonly and controllably rotatable around the rotation axis by means of a rotation drive, each of the grasping arms comprising a grasping unit configures to controllably grasp and release a holder carrier either as a single part or, if the holder carriers are composed of distinct segments, by grasping and releasing a holder carrier segment by segment.

In one embodiment of the just addressed embodiment of the apparatus according to the invention the central axis of one of the holder carrier on the first holder carrier support and the central axis of one of the holder carrier on the second holder carrier support and the rotation axis are mutually parallel.

In one embodiment of the apparatus according to the invention the grasping arms are controllably expandable and retractable independently from one another.

In one embodiment of the apparatus according to the invention each one of the grasping arms is only retractable and expandable if the other grasping arm is retracted.

In one embodiment of embodiments as just addressed of the apparatus according to the invention the grasping units grasp and release the holder carriers or the segments of the holder carriers by pin($51v,51b$) and bore ($53v,53b$)-links.

In one embodiment of embodiments as just addressed the pin and bore links are established and released by relative movements of pins ($51v,51b$) and bores ($53v,53b$) in radial direction with respect to the rotation axis. We understand under "bore" also a guide as e.g. a one side open rail.

In one embodiment of the apparatus according to the invention the second gate valve is in a bottom wall of the transfer vacuum chamber and the further conveyer comprises a controllably driven elevator drivingly movable towards and from said bottom wall and carrying a valve plate oriented parallel to the bottom wall, the valve plate sealing the transfer vacuum chamber as the elevator is in a position nearest to the bottom wall.

One embodiment of the apparatus according to the invention comprises at least two of the second gate valve and the further conveyer is configured to convey a holder carrier through one of said at least two second gate valves from said second holder carrier support and to convey a holder carrier through another of said at least two second gate valves onto said second holder carrier support.

In one embodiment of the apparatus according to the invention the further conveyer is configured to convey a holder carrier, bidirectionally, forth and back through one of said at least one second gate valves from and onto the second holder carrier support.

In one embodiment of the apparatus according to the invention the holder carrier comprises at least two of the substrate holders or a multitude of the substrate holders.

In one embodiment of the apparatus according to the invention the at least one substrate holder is inseparable from the holder carrier or is a distinct part separable from said holder carrier.

In one embodiment of the apparatus according to the invention the exchange conveyer comprises at least two expandable and retractable grasping arms expandable and retractable relative to a rotation axis of the exchange conveyer and commonly and controllably rotatable around the rotation axis by means of a rotation drive. The grasping arms have a stroke to grasp and, respectively, release a holder carrier from and on the first holder carrier support through the first gate valve and to grasp and, respectively, release a holder carrier from and on the second holder carrier support.

In one embodiment of the just addressed embodiment of the apparatus according to the invention the grasping arms are frog-leg type arms.

In one embodiment of the just addressed embodiment both grasping arms consist of the same frog type legs.

In one embodiment of the just addressed only one of the grasping arms is expandable at a time.

One embodiment of the apparatus according to the invention comprises a loading/unloading conveyer (63) in ambient atmosphere, configured to load and unload at least one substrate on and from the substrate holder in ambient atmosphere.

One embodiment of the apparatus according to the invention comprises a timing unit controlling at least operation of the further conveyer and of the second gate valve and being configured to control operation of the further conveyer to exchange a holder carrier on the second holder carrier support during treatment-operation of the vacuum treatment chamber.

As the further conveyer is controlled to exchange a holder carrier with at least one treated substrate on the second holder carrier support by a holder carrier with at least one untreated substrate, and due to the load-lock configuration of the transfer vacuum chamber, the treatment atmosphere in the vacuum treatment chamber needs not to be changed and the treatment process is only interrupted for the action of the exchange conveyer.

In one embodiment of the apparatus according to the invention a) the vacuum treatment chamber is an evaporation coating chamber and comprises at least one evaporator source;

b) the holder carrier comprises at least two distinct segments and is calotte-shaped;

c) the first and second holder carrier supports are calotte-frame shaped and are controllably rotatable around a respective center axis.

The embodiment addressed above may be realized in any combination, unless being contractionary.

The invention is further directed to a holder carrier adapted to be used in an apparatus according to the invention which holder carrier is constructed to hold the extended surfaces of at least two substrates applied thereto to be freely exposed to the surrounding along an extended surface of the holder carrier, the extended surface of the holder carrier extending around a central axis directed traverse to the extended surface of the holder carrier, the holder carrier comprising at least two distinct segments each with at least one substrate holder, which segments may be assembled to result in said holder carrier and disassembled.

In one embodiment of the holder carrier according to the invention, the holder carrier is calotte-shaped.

The invention is further directed to a method of manufacturing vacuum treated substrates by which the object as addressed above, namely of improving the substrate throughput is achieved. The method of manufacturing vacuum treated substrates thereby comprises:

Providing more than one holder carriers, each of the holder carriers comprising an extended surface and at least one substrate holder distributed along the extended surface, the at least one substrate holder being constructed to hold an extended surface of a substrate resting therein to be freely exposed to the surrounding along the extended surface of the holder carrier, the extended surface of each holder carrier extending around a central axis of the holder carrier which axis is directed traverse to the extended surface of the holder carrier;

Providing at least one vacuum treatment chamber constructed to treat the at least one substrate on a single of the holder carriers;

Providing a transfer vacuum chamber connected via a gate valve to the at least one vacuum treatment chamber and performing the further steps of:

a) Treating the substrates on one of the holder carriers at a time in the vacuum treatment chamber, resulting in treated substrates on the one holder carrier, thereby performing the treating at a process pressure in the vacuum treatment chamber, the treating lasting during a treatment time span;

b) During the treating time span:

b1) conveying one of said holder carriers with previously treated substrates from said transfer vacuum chamber towards ambient thereby venting the transfer vacuum chamber, and b2) conveying one of said holder carriers with untreated substrates from ambient into the transfer vacuum chamber and establishing process pressure in the transfer vacuum chamber, c) After the treating, exchanging in the vacuum treatment chamber the one holder carrier with treated substrates by the holder carrier with untreated substrates from the transfer vacuum chamber through the gate valve and exchanging, in the transfer vacuum chamber, the one holder carrier with untreated substrates by one holder carrier with treated substrates from the vacuum treatment chamber through the gate valve;

d) Repeating steps, a) to c).

One variant of the method according to the invention comprises performing unloading at least one treated substrate from one holder carrier and loading at least one untreated substrate on one of the holder carriers in ambient atmosphere.

One variant of the just addressed variant of the method according to the invention, comprises unloading the at least one treated substrate from one holder carrier and loading the at least one untreated substrate to the same holder carrier.

One variant of the method according to the invention comprises constructing each holder carrier by at least two distinct segments at least one thereof comprising at least one substrate holder and performing step c) by exchanging segments.

Thereby a further variant of the just addressed variant, comprises performing the exchanging by repeatedly exchanging in the vacuum treatment chamber one segment by one segment from the transfer vacuum chamber and, in the transfer vacuum chamber, by repeatedly exchanging one segment by one segment from the vacuum treatment chamber.

In one variant of the method according to the invention, the addressed treating is evaporation coating, and the holder carrier is selected as a calotte.

In one variant of the method according to the invention the method is performed making use of the apparatus according to the invention or of one or more than one of the embodiments of that apparatus.

The variants of the method according to the invention may be performed in any combination unless being contractionary.

Figure 7:
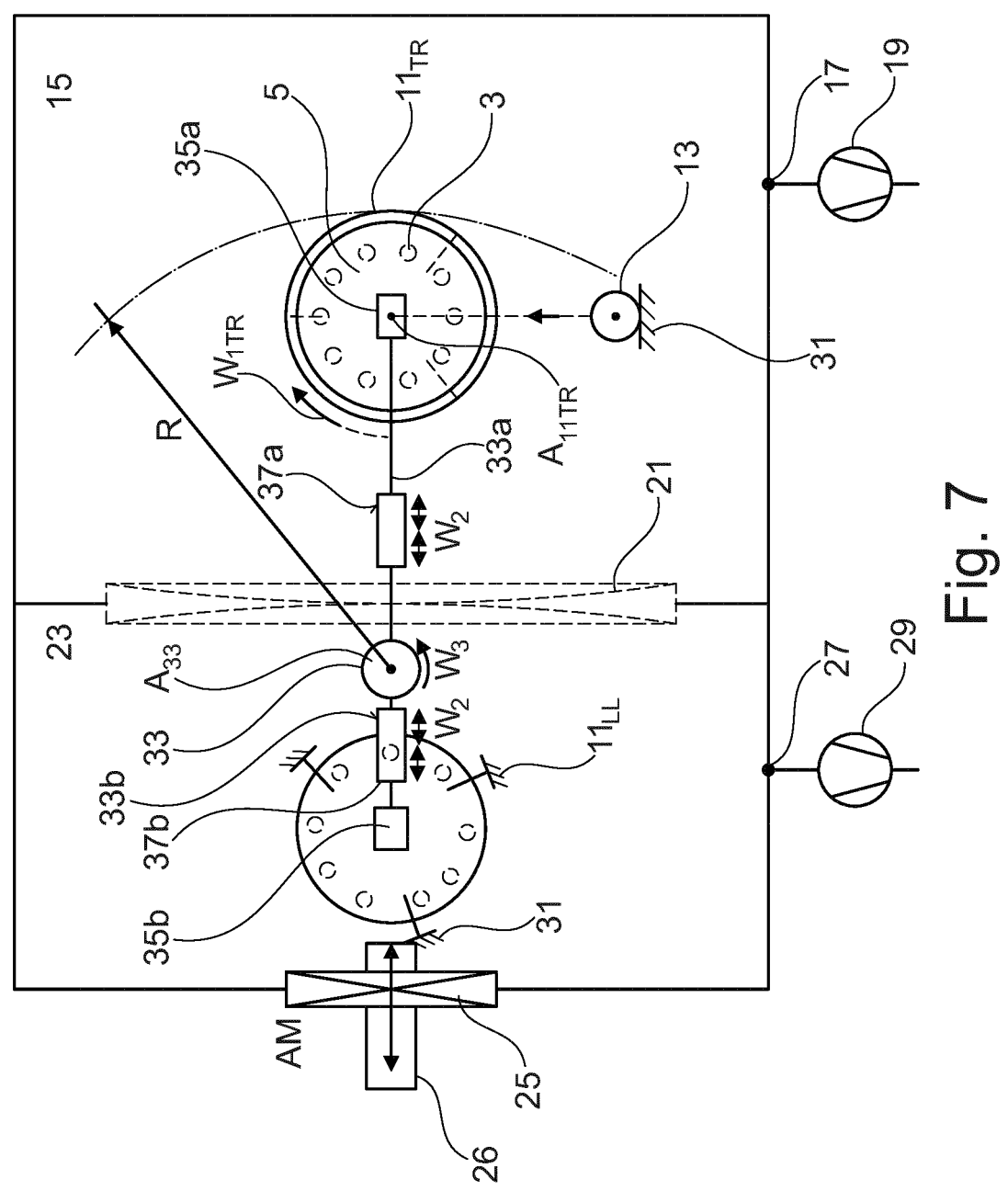
Figure 8:
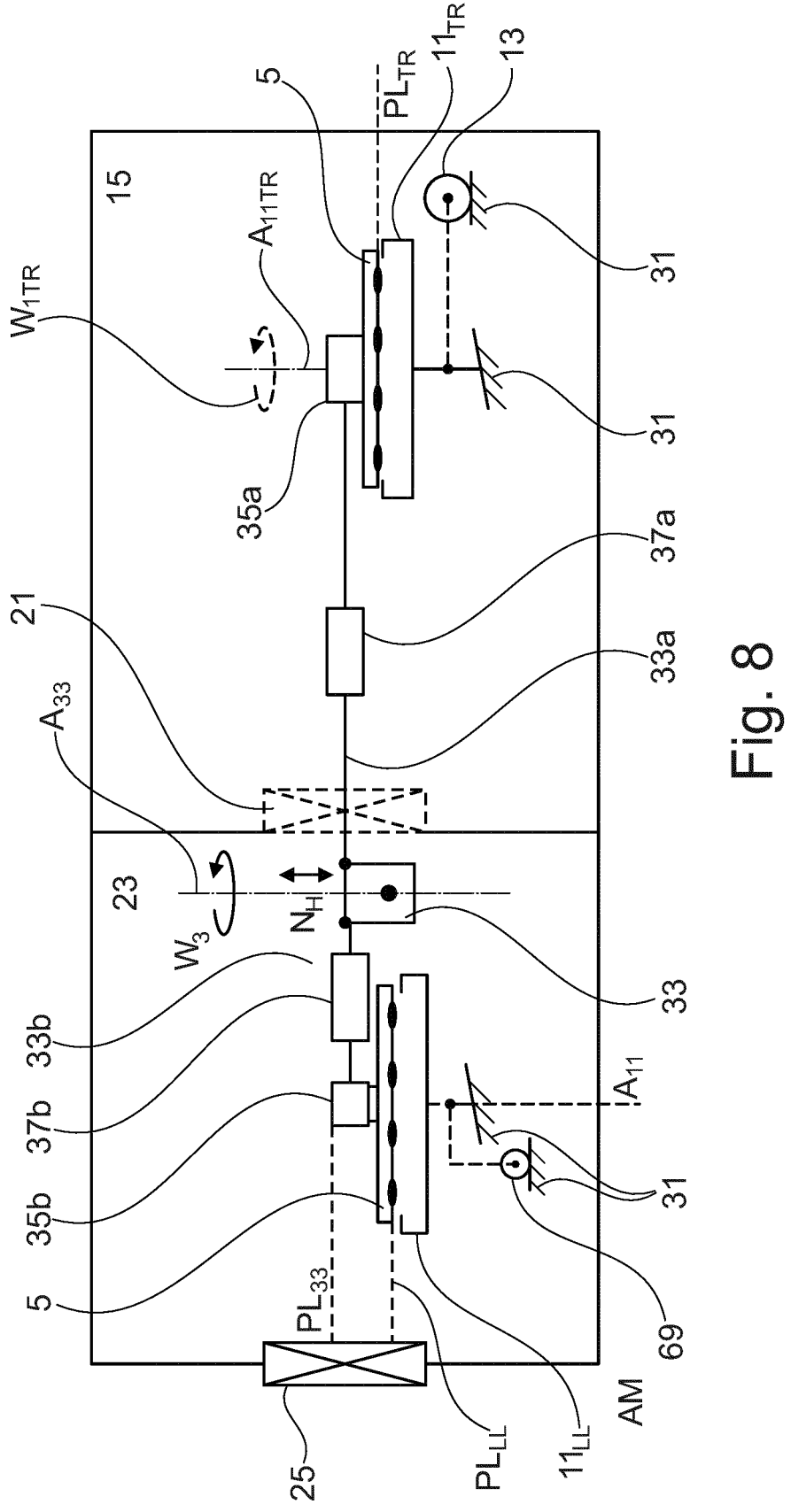
Figure 9:
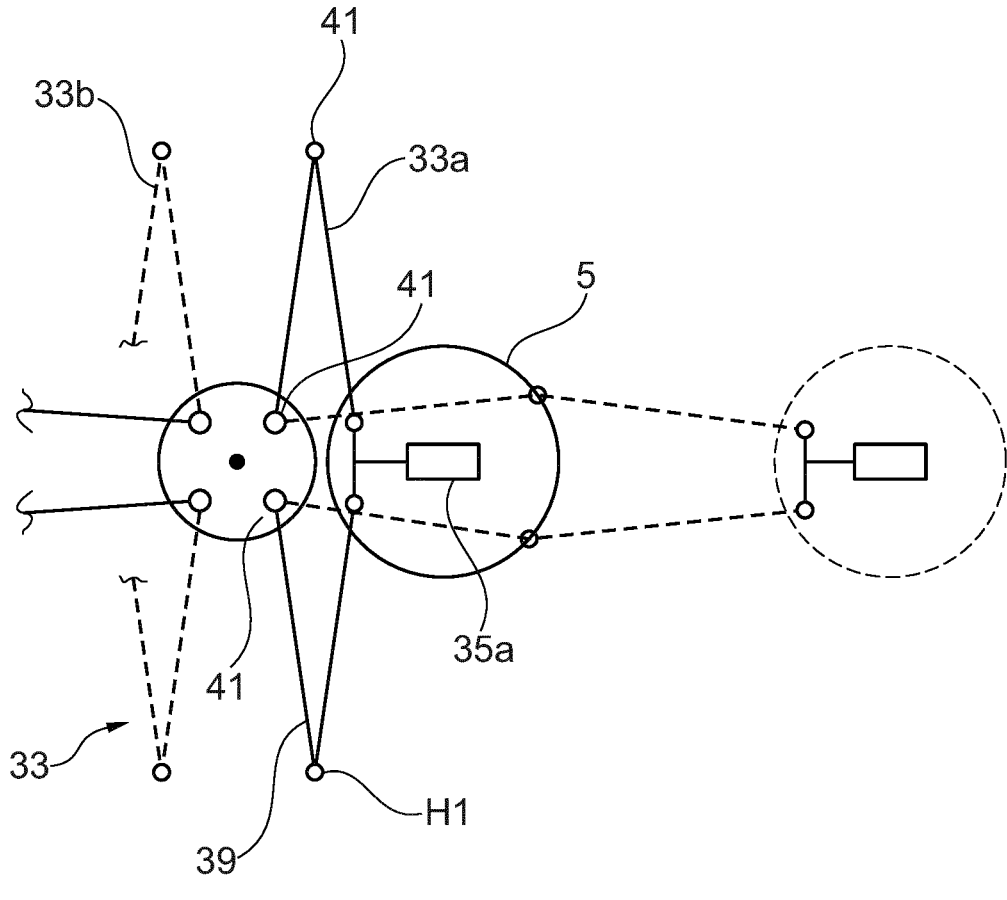
Figure 11:
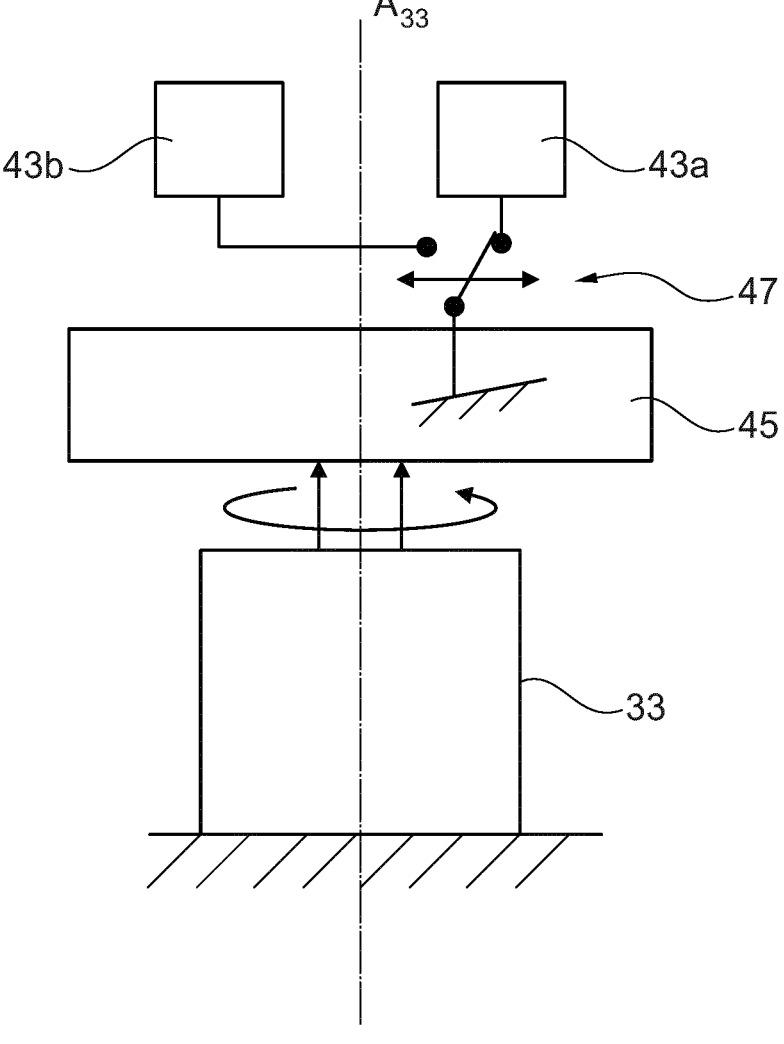
Figures 12, 13:
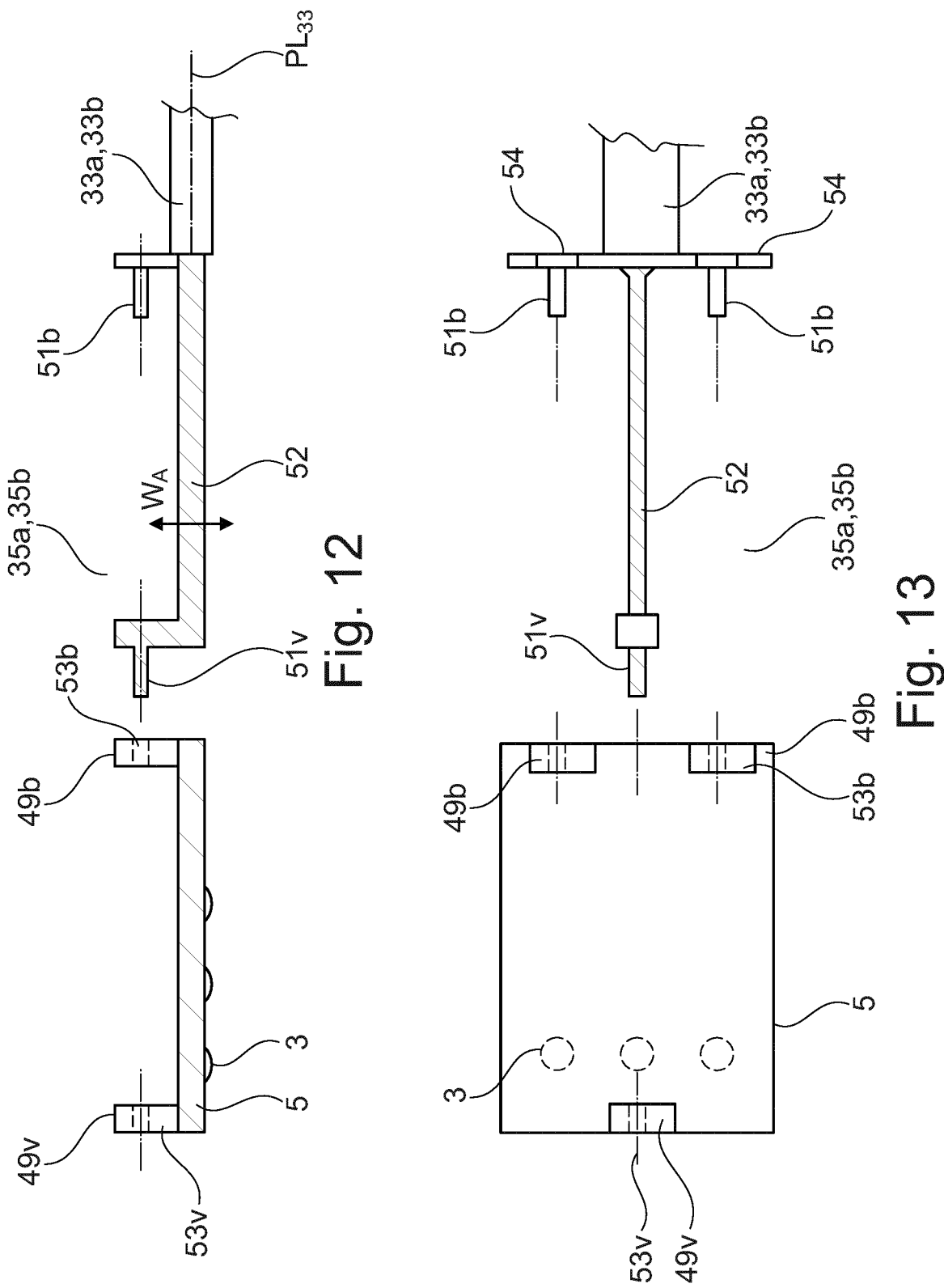
Figure 14:
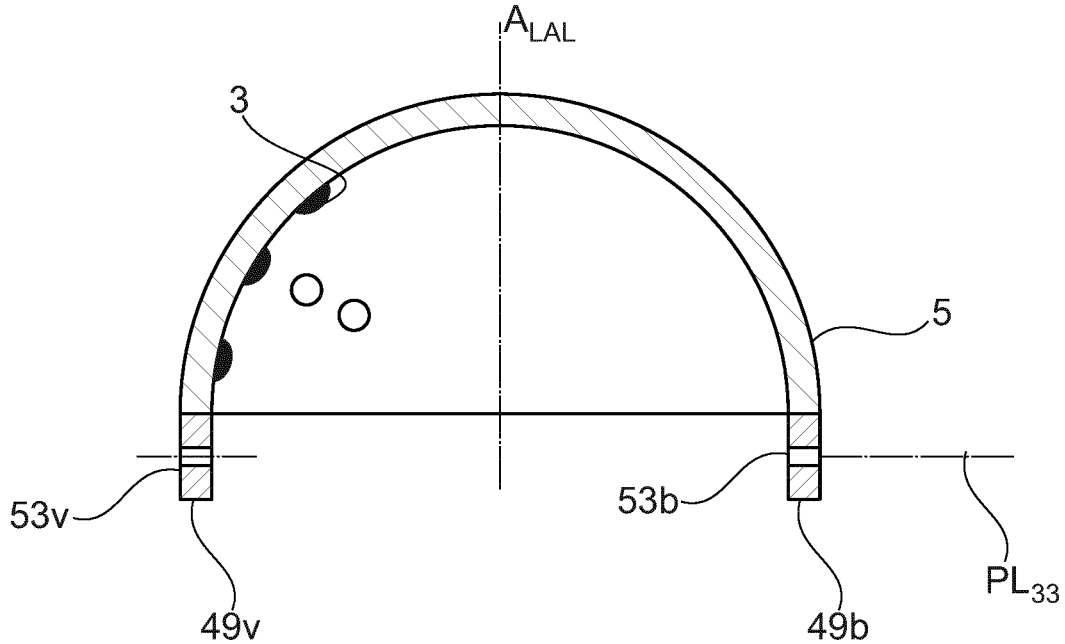
Figures 15, 16:
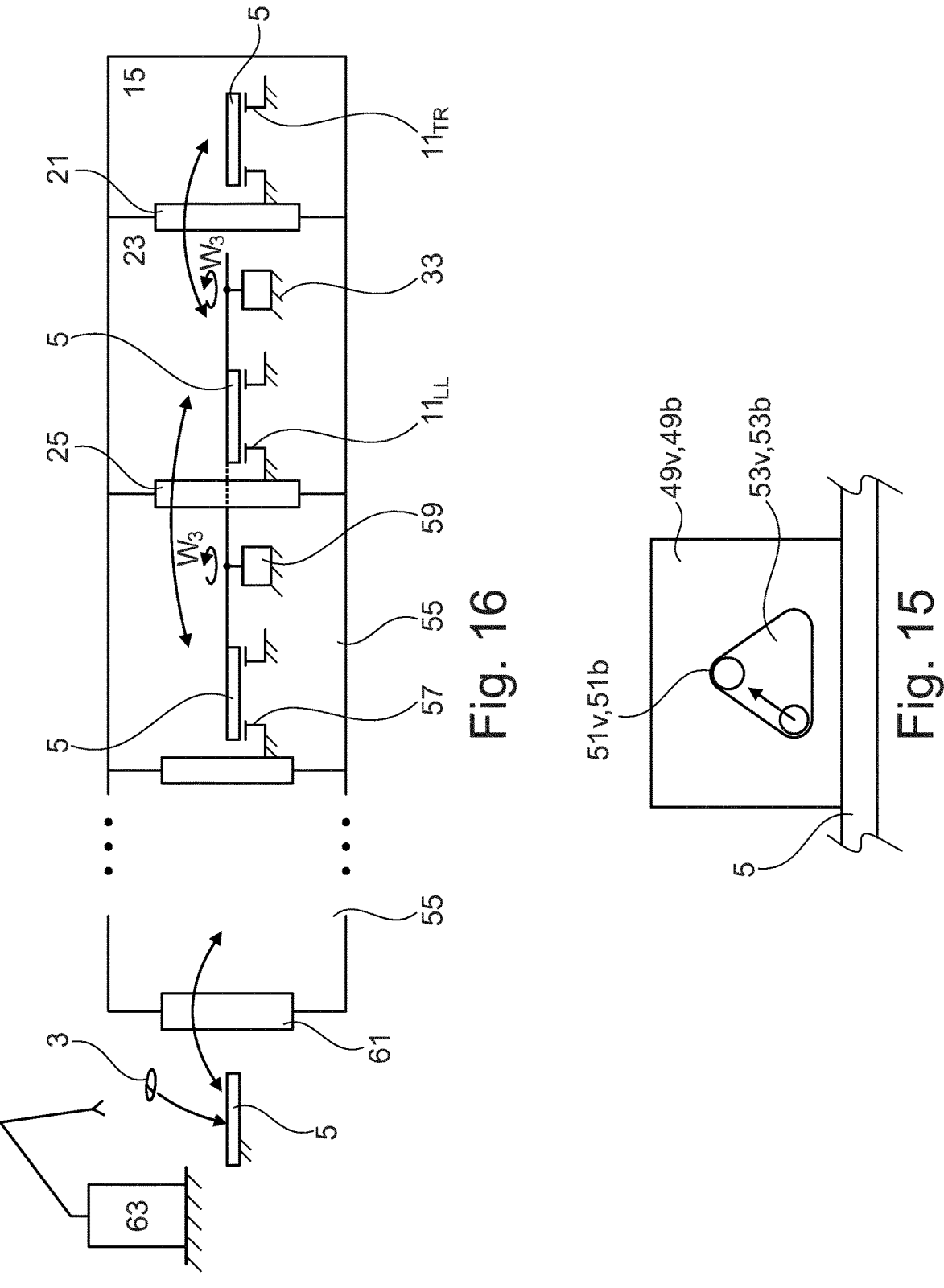
Figure 17:
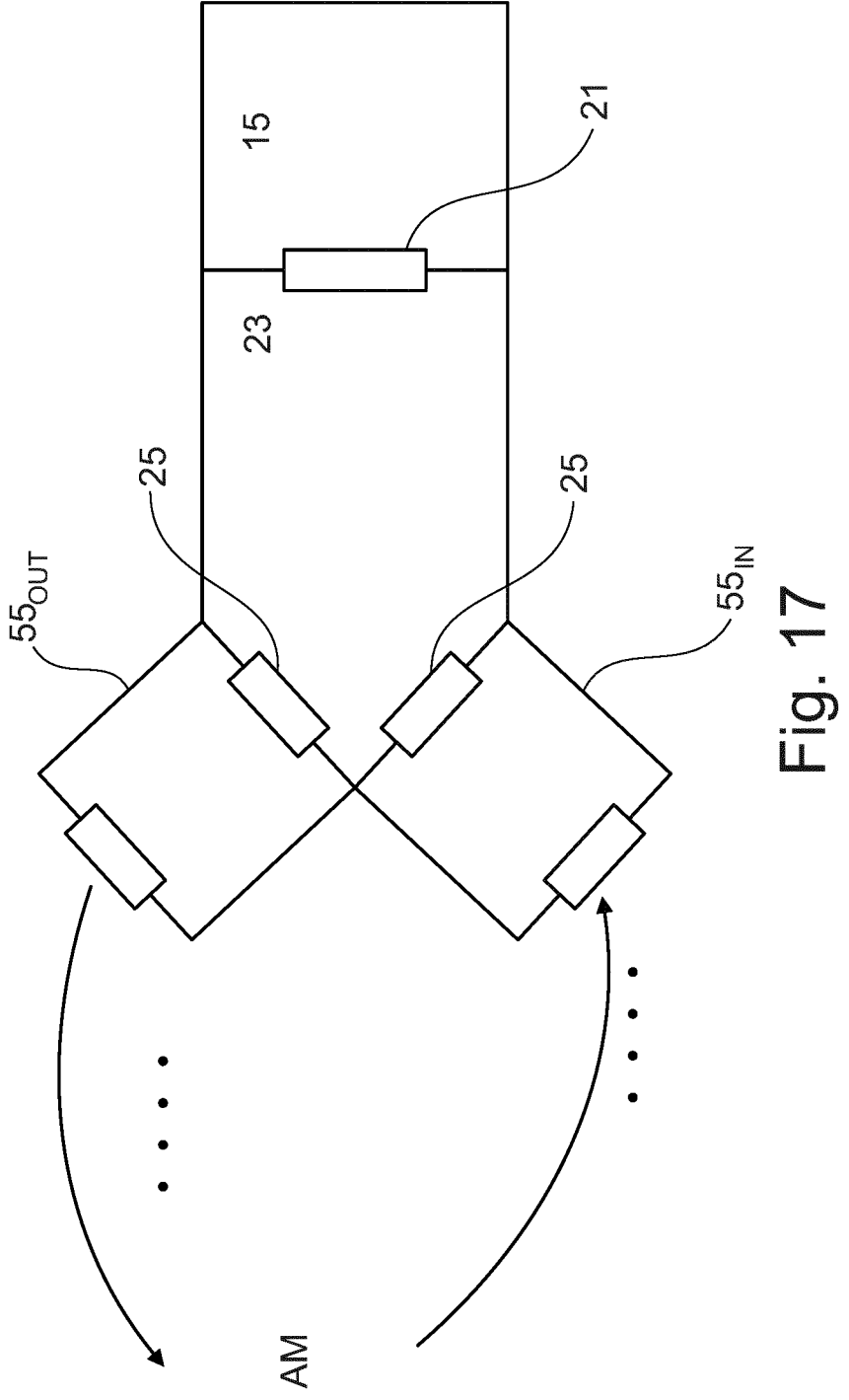
Figure 18:
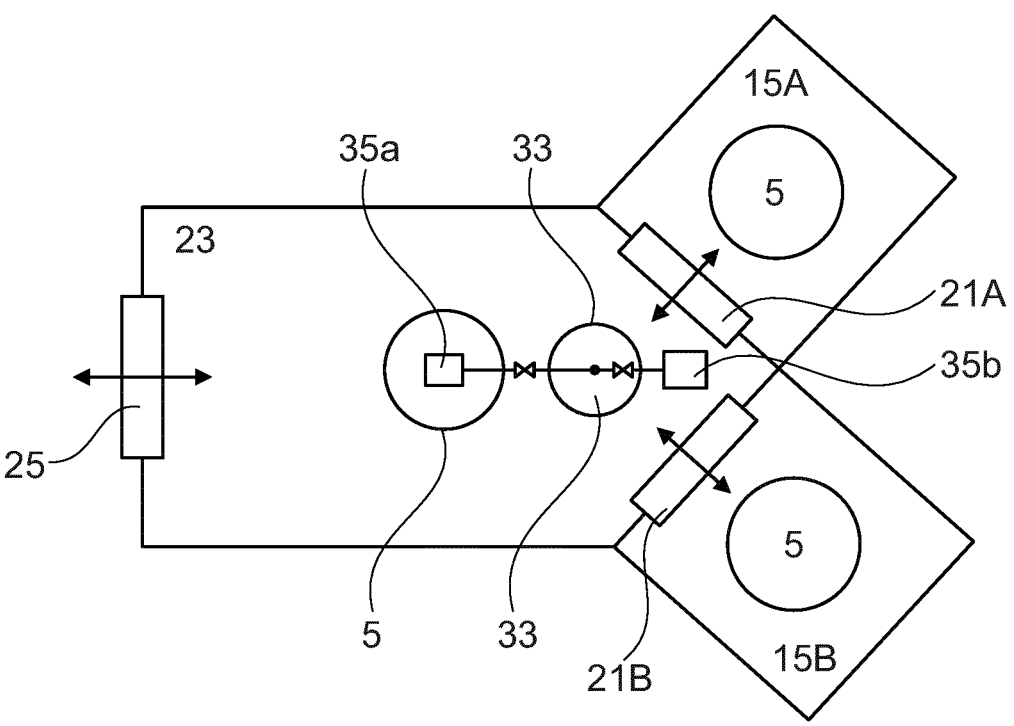
Figure 19:
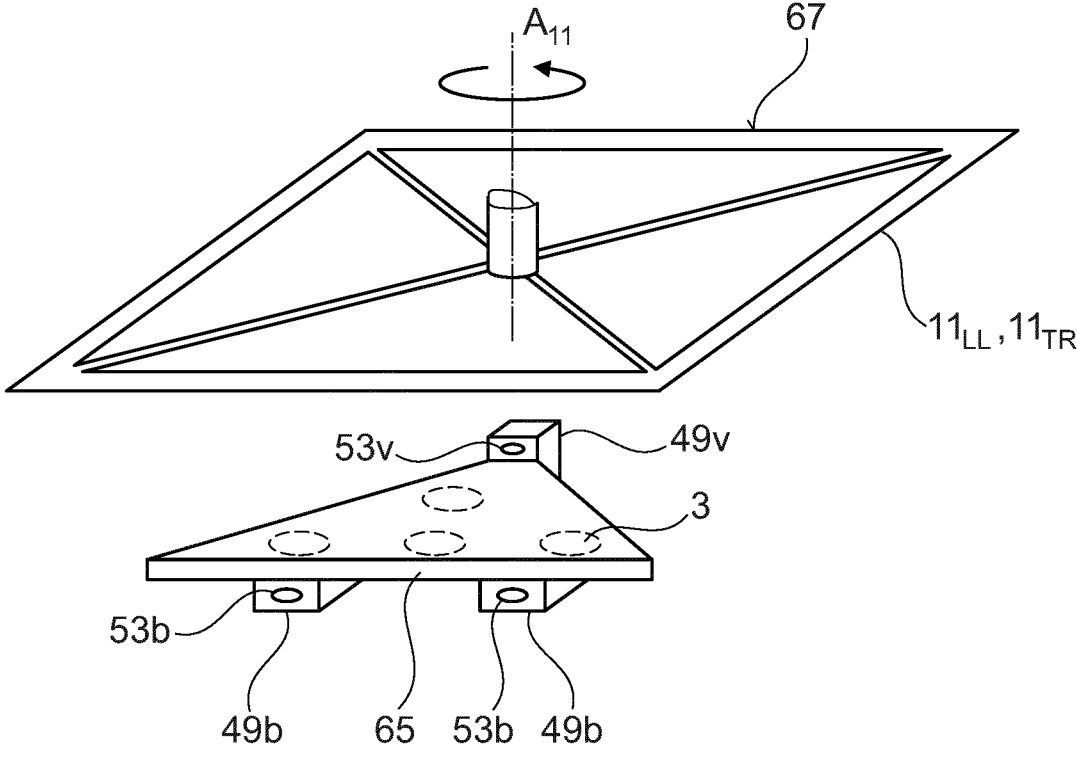
Figure 20:
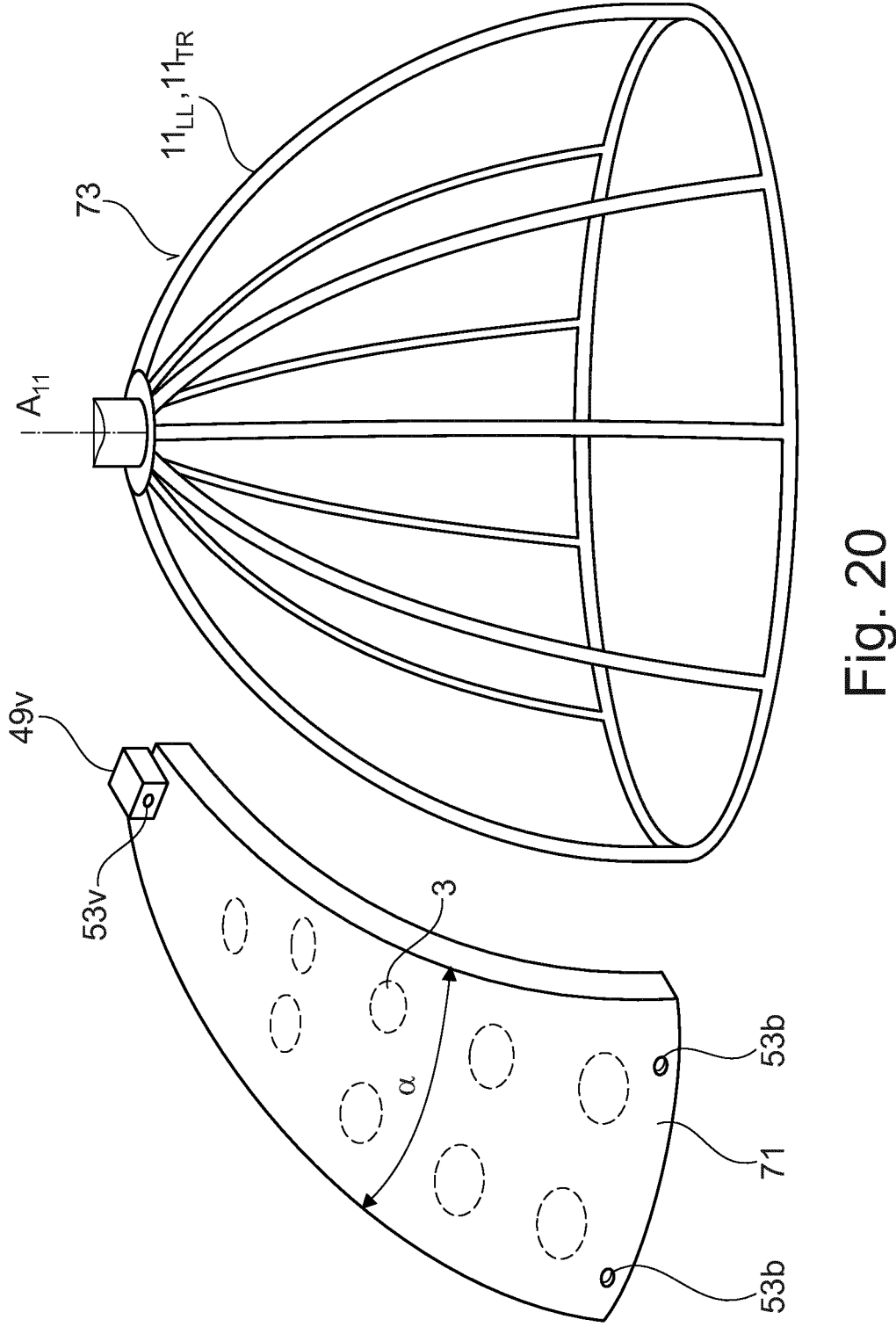
Figure 21:
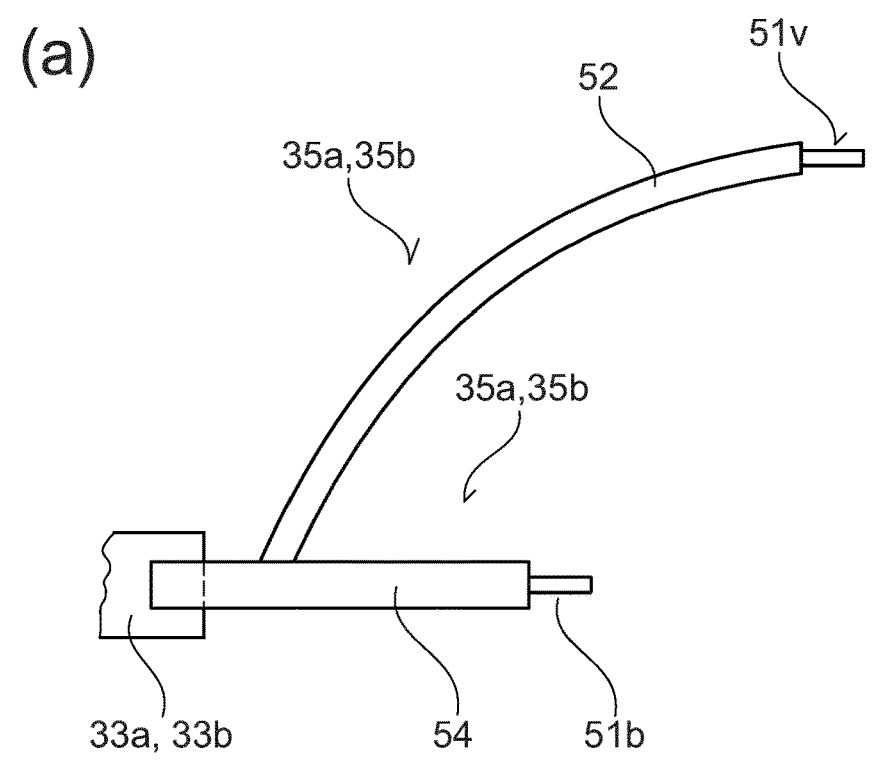
Figure 21:
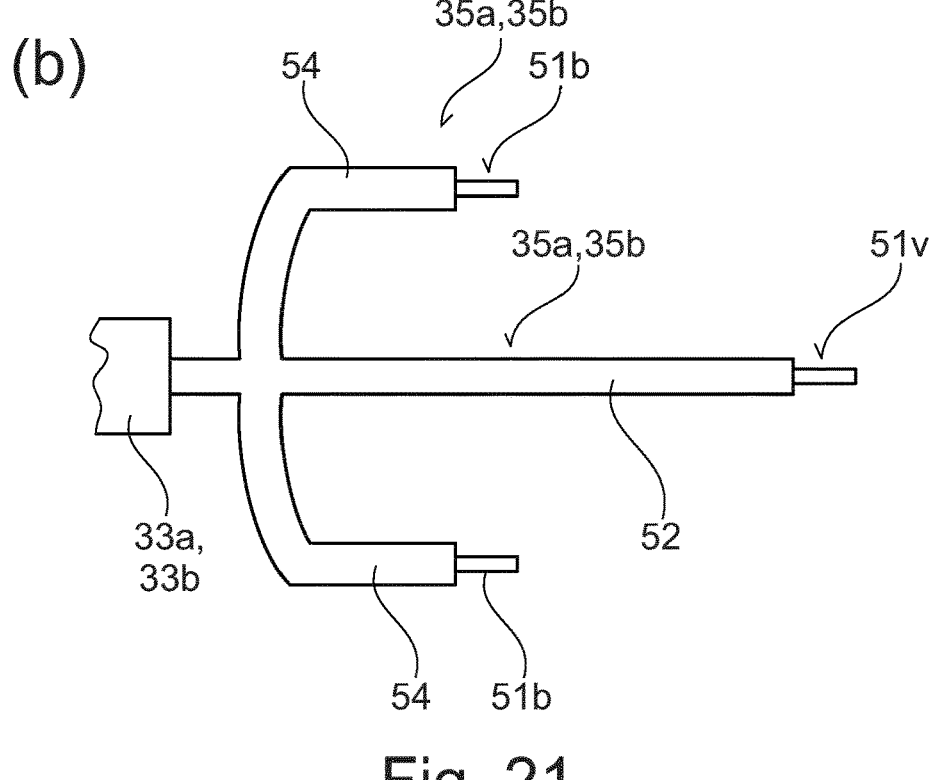
Figure 22:
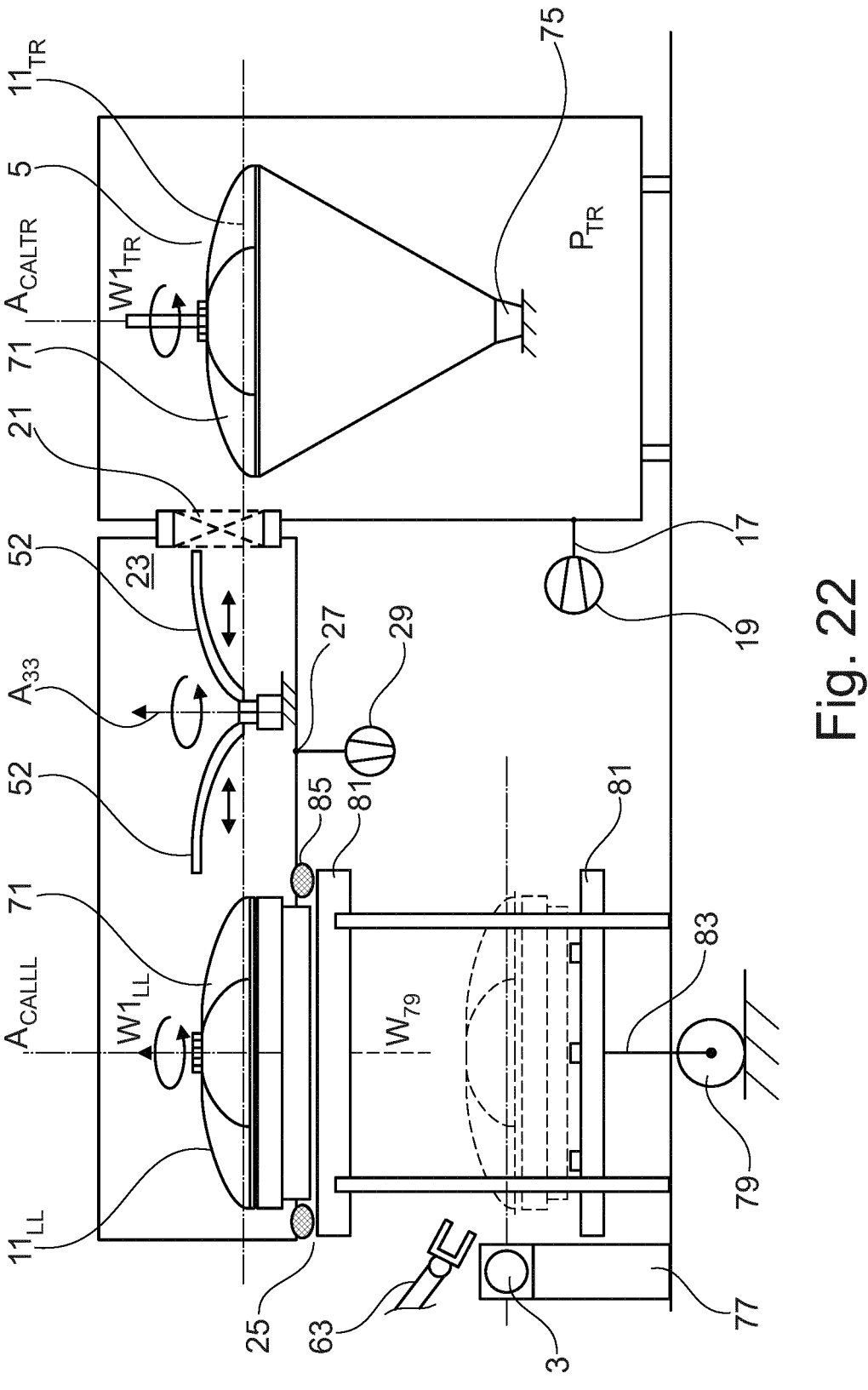

The apparatus and the method according to the invention shall now be further exemplified with the help of figures. The figures show:

FIG. 1: schematically a part of a holder carrier with a substrate holder in cross-sectional representation;

FIG. 2: in a representation in analogy to that of FIG. 1 a part of a holder carrier;

FIG. 3: schematically an embodiment of a holder carrier in cross-sectional representation;

FIG. 4a): schematically a top view of an embodiment of a holder carrier;

FIG. 4$b$): schematically a top view of an embodiment of a holder carrier;

FIG. 5: schematically and simplified a lateral view of an embodiment of a holder carrier support;

FIG. 6: schematically and simplified a top view on an embodiment of a holder carrier support;

FIG. 7: schematically and simplified an embodiment of the apparatus according to the invention, suited to perform a variant of the method according to the invention in a top view;

FIG. 8: the embodiment as shown in FIG. 7 in a lateral view;

FIG. 9: schematically and simplified, an embodiment of an exchange conveyer, as may be applied in the apparatus according to the invention;

FIG. 10: schematically and simplified, an embodiment of an exchange conveyer, as may be applied in the apparatus according to the invention thereby:

FIG. 10$a$: both grasping arms in retracted position;

FIG. 10$b$: one grasping arm in expanded position;

FIG. 10$c$: the other grasping arm in expanded position;

FIG. 11: most schematically the mechanical blocking operations of parts of the exchange conveyer as represented in the FIGS. 10$a$ to 10$c$;

FIG. 12: schematically a cross-sectional representation of an embodiment of a grasping unit as applicable to the apparatus according to the present invention;

FIG. 13: a top view on the grasping unit of FIG. 12;

FIG. 14: in a schematic and simplified cross-sectional representation, a calotte-shaped holder carrier with parts of the grasping unit in analogy to that shown in the FIGS. 12 and 13;

FIG. 15: schematically the shape of an embodiment of grasping bores, cooperating with grasping pins as shown in the FIG. 12 to 14;

FIG. 16: schematically and simplified, an embodiment of the apparatus according to the invention, performing the method according to the invention;

FIG. 17: schematically and simplified, a further embodiment of the apparatus according to the invention, performing the method according to the invention;

FIG. 18: schematically and simplified, a further embodiment of the apparatus according to the invention, performing the method according to the invention;

FIG. 19: in a schematic, simplified perspective representation of an embodiment of a holder carrier segment and of a frame shaped respective holder carrier for supporting a holder carrier composed of such segments, as of an embodiment of the apparatus according to the invention;

FIG. 20: in a schematic, simplified perspective representation of an further embodiment of a holder carrier segment and of a frame shaped respective holder carrier for supporting a holder carrier composed of such segments, as of an embodiment of the apparatus according to the invention;

FIG. 21($a$): schematically a lateral view of an embodiment of a grasping unit as applicable to a segment of a calotte-shaped holder carrier in an embodiment of the apparatus according to the present invention;

FIG. 21($b$: a top view on the grasping unit of FIG. 21($a$);

FIG. 22: schematically, an embodiment of the apparatus according to the invention and performing the method according to the invention, as practiced today.

Figure 23:
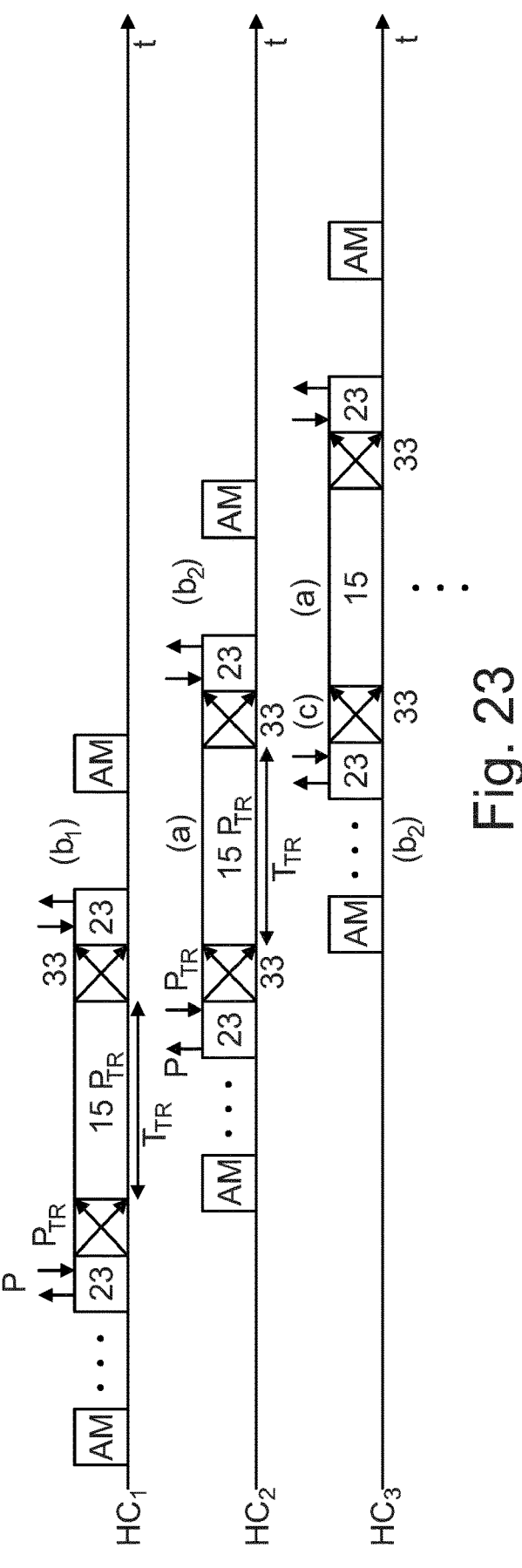
Figure 24:
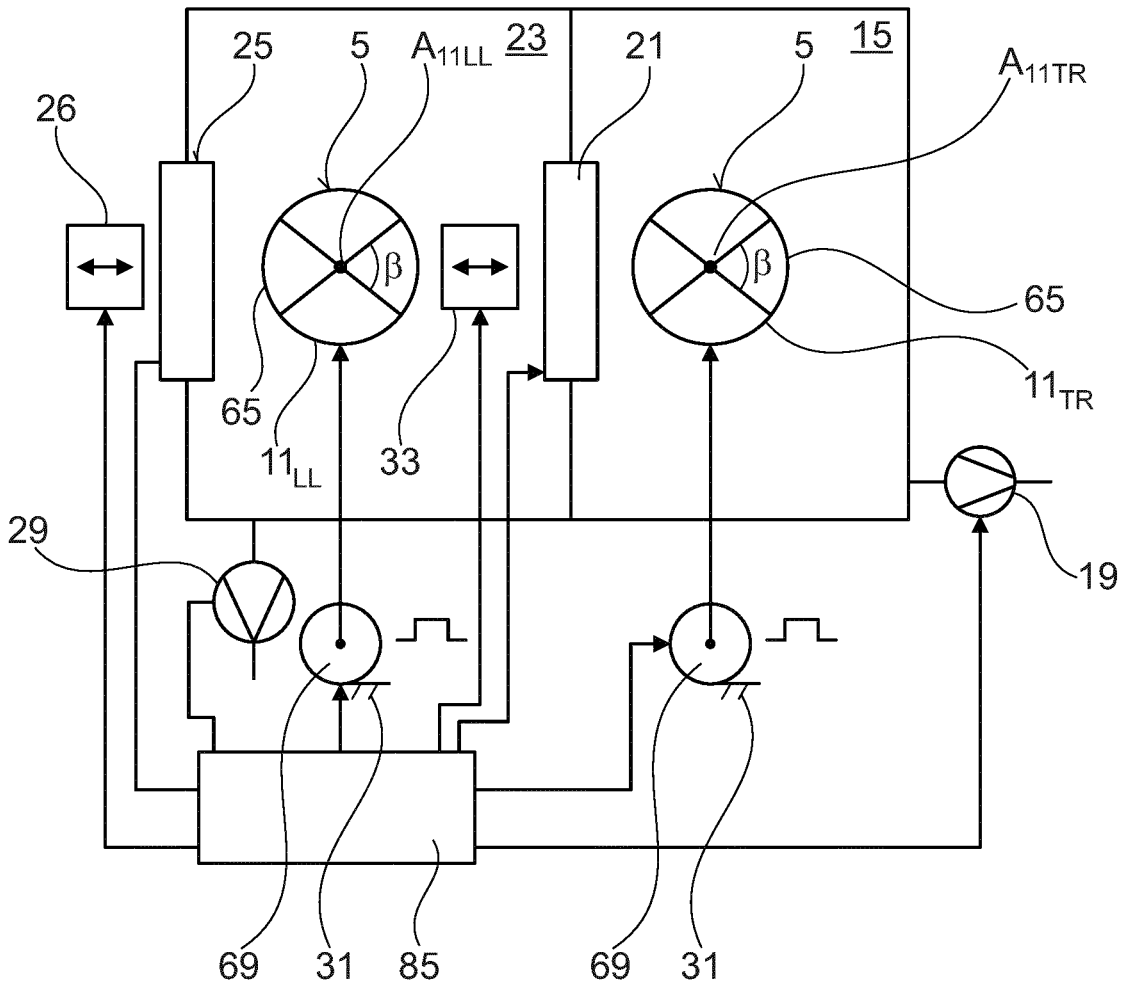

FIG. 23: schematically and simplified the timing diagrams of the subsequent handling of holder carriers in an embodiment of the apparatus according to the invention and according to a variant of the method according to the invention;

FIG. 24: Schematically and simplified an embodiment of an apparatus according to the invention and performing a variant of the method according to the invention, whereat the holder carriers are composed of distinct segments.

FIGS. 7 and 8 show simplified and schematically in a side view and in a top view, respectively, an embodiment of the apparatus according to the invention and operating the method according to the invention.

Inside a vacuum treatment chamber 15 a holder carrier support HCS $11_{TR}$ is provided, stationarily or rotatable around a vertical axis $A_{11TR}$ by a drive 13 as shown in dash line and by arrow $W_{11TR}$. Generically the treatment chamber 15 may be a chamber wherein any type of vacuum processing on surfaces of substrates 3 may be performed. Thus, the vacuum treatment chamber 15 is (not shown) provided with the respective equipment to perform the desired vacuum process.

The vacuum treatment chamber 15 comprises a pumping port 17, to apply a pump 19 thereto.

The vacuum treatment chamber 15 communicates via a gate valve 21 with a transfer vacuum chamber 23 and the transfer vacuum chamber 23 via a further gate valve 25, either directly to ambient atmosphere AM or via one or more than one further vacuum chamber (not shown), towards ambient atmosphere AM. The transfer vacuum chamber 23 comprises a pumping port 27 to apply a pump 29 thereto.

The vacuum transfer chamber 23 thus in fact acts as a load lock chamber with respect to pressure handling.

In the transfer vacuum chamber 23 there is provided a HCS $11_{LL}$, which, in the embodiment according to the FIGS. 7 and 8 is stationary as schematically shown by the "stationary" sign at 31 which is used throughout the figures.

The HCS $11_{TR}$ and $11_{LL}$ are adapted in this embodiment to position a holder carrier HC 5, respectively, along parallel planes $PL_{TR}$ and $PL_{LL}$. If the HC 5 has a plane extended surface 9 along which the extended surfaces 7 of a substrate or the extended surfaces 7 of more than one substrate 3 are freely exposed, then the planes $PL_{TR}$ and $PL_{LL}$ accord with the extended surface 9. If the HC 5 is calotte-shaped, then the addressed planes $PL_{TR}$ and $PL_{LL}$ are perpendicular to the central axis $A_{HC}$ of the holder carrier 5 as shown in FIG. 3.

An exchange conveyer 33, e.g. an exchange robot, resides in the transfer vacuum chamber 23, between the HCS $11_{LL}$ and the gate valve 21. The exchange conveyer 33 comprises a pair of extendable and retractable grasping arms 33$a$ and 33$b$, each equipped with a terminal grasping unit, 35$a$ and 35$b$ respectively and as schematically shown. By each grasping unit 35$a$,35$b$ a holder carrier HC 5 may be grasped from or released on one of the respective holder carrier supports HCS $11_{TR}$ and $11_{LL}$ when the respective grasping arm is extended. As shown schematically, each of the grasping arms 33$a$, 33$b$ is controllably extendable and retractable by means of extension drives 37$a$, 37$b$. The grasping arms 33$a$,33$b$ are operated for extension and retraction as addressed by the double arrows W2 along an extension plane $PL_{33}$ which is perpendicular to a rotation axis $A_{33}$-W3- of the exchange conveyer 33. Thus the grasping arms may be controllably and drivingly rotated around the rotation axis $A_{33}$ and may be extended and retracted along the plane PL 33 which is parallel to the positioning planes $PL_{TR}$ and $PL_{LL}$. Especially if the planes $PL_{LL}$ and $PL_{TR}$ are not identical the exchange robot 33 may lift and lower the grasping arms 33$a$, 33$b$ as schematically shown by the arrow W4. The axes $A_{11TR}$, $A_{11LL}$ and $A_{33}$ may be parallel and may thereby be vertically oriented. Once applied on one of the holder carrier supports $11_{TR}$, $11_{LL}$ the central axis $A_{HC}$ of the respectively applied HC 5 may coincide with the respective axes $A_{11TR}$, $A_{11LL}$.

In operation, the exchange conveyer 33 grasps with one of the grasping arms 33a or 33b and from the HCS $11_{TR}$, a holding carrier HC 5, the one or more than one substrates 3 thereon having been treated in the vacuum treatment chamber 15, and grasps with the other grasping arm 33b or 33a and from the HCS $11_{LL}$ a HC 5, the one or more than one substrates 3 thereon having yet not been treated in the vacuum treatment chamber 15. After having been retracted, the grasping arms 33a,33b are commonly swiveled around the rotation axis $A_{33}$, are then expanded, and the grasping arm 33a carrying the HC 5 with at least one treated substrate 3 deposits that HC 5 on the HCS $11_{LL}$, whereas the other grasping arm 33b carrying the HC 5 with yet untreated substrates 3, deposits that HC 5 on the HCS $11_{TR}$. This exchange operation is performed with the gate valve 21 open, the gate valve 25 closed and the pressure in the transfer vacuum chamber 23, acting as a load lock, equal to the processing pressure in the vacuum treatment chamber 15. Thus, the vacuum treatment chamber 15 is neither vented nor pumped for a series of succeeding HC 5 to be processed. Thereby the throughput of HC5 with treated substrates is significantly improved. Adaption of the pressure in the transfer vacuum chamber 23 on one hand to the pressure outside gate valve 25, e.g. by venting to ambient atmosphere, and, on the other hand to the processing pressure in the vacuum treatment chamber 15 is performed during processing of a HC 5 with its substrates 3 in the vacuum treatment chamber 15. Thereby the volume of the transfer vacuum chamber 23 may often be selected significantly smaller than the volume of the vacuum treatment chamber 15 because processing equipment, e.g. an evaporation source, a sputtering source etc. is to be installed in the vacuum treatment chamber 15 for the respective process. Venting and repressurizing the transfer vacuum chamber is performed within a time span which is significantly shorter than the processing time span for a holder carrier 5 in the vacuum treatment chamber 15 and which is significantly shorter than a time span that would be needed to vent and repressurize the vacuum treatment chamber 15.

The handling steps for the HC 5 and thus a variant of the method according to the invention shall be explained with the help of the timing diagrams of FIG. 23.

For initiating processing, a first HC1, residing in ambient atmosphere AM, is conveyed into the transfer vacuum chamber 23, acting as a load lock chamber. As indicated by the double arrows p the pressure in the transfer vacuum chamber 23 is, from first being vented to higher pressure, lowered to the processing pressure $p_{TR}$ needed for treating the substrates 3 in the vacuum treatment chamber 15.

Then the HC1 is transferred into the vacuum treatment chamber 15, which has been pumped down to the process pressure $p_{TR}$. The HC1 with the at least one substrate 3 is treated in the vacuum treatment chamber 15.

During the treatment time span $T_{TR}$ of the HC1, a HC2 is conveyed from ambient AM to the transfer vacuum chamber 23. To do so the transfer vacuum chamber 23 is vented and once the HC2 is inside, is pumped down to the processing pressure $p_{TR}$.

Once the treatment of HC1 is terminated and HC2 in the transfer vacuum chamber 23 and the transfer vacuum chamber 23 on process pressure $p_{TR}$, the HC1 and the HC2 are exchanged by the exchange conveyer 33. This means that the HC1 with treated substrates 3 in the vacuum treatment chamber 15 is replaced by the HC2 with untreated substrates from the transfer vacuum chamber 23 and—vice versa—the HC2 with untreated substrates in the transfer vacuum chamber 23 is replaced by HC1 with treated substrates from the vacuum treatment chamber 15.

The transfer vacuum chamber 23 wherein the HC1 now resides is vented from process pressure $p_{TR}$ and the HC1 is conveyed towards ambient AM during the time span $T_{TR}$ during which HC2 is treated in the vacuum treatment chamber 15.

The time sequence which is lived by the third HC3 becomes now evident to the skilled artisan.

Thus, there becomes clear, that more than one holder carriers 5, HC1 to HC3 are provided. One is being treated in the vacuum treatment chamber 15, during the treatment time span $T_{TR}$ one holder carrier 5 is conveyed from ambient towards and into the transfer vacuum chamber 23 and one holder carrier 5 is conveyed from the transfer vacuum chamber 23 towards ambient. Each of the holder carriers 5 comprises, as was addressed, an extended surface 9 and at least one substrate holder 1 along the extended surface 9. Each of the substrate holders 1 is constructed to hold an extended surface 7 to be treated of a substrate 3 resting in a substrate holder, to be freely exposed to the surrounding along the extended surface 9 of the holder carrier 5. The extended surface 9 of each holder carrier 5 extends around a central axis $A_{HC}$ of the holder carrier 5, which axis is directed traverse to the extended surface 9 of the holder carrier 5;

The vacuum treatment chamber 15 is constructed to treat the at least one substrate 3 on a single of the holder carriers 5. Thus, a holder carrier 5 may be introduced into, treated in and removed from the vacuum treatment chamber 15 only consecutively, one by one.

At a time, the at least one substrate 3 on one of the holder carriers 5 is treated in the vacuum treatment chamber 15. Tis step is indicated in FIG. 23 at (a). This results in treated substrates 3 on the one holder carrier 5 in the vacuum treatment chamber 15. The treating in the vacuum treatment chamber 15 is performed at the process pressure $p_{TR}$ which is selected according to the desired treatment process of the substrates in the vacuum treatment chamber 15. The treating lasts during the treatment time span $T_{TR}$;

Within the treating time span $T_{TR}$, one of the holder carriers 5 with at least one treated substrate 3 is conveyed from the transfer vacuum chamber 23 towards ambient AM, through the gate valve 25 and according to the embodiment of the FIGS. 7 and 8 by the conveyer 26. Thereby the treatment vacuum chamber 23 is vented towards a higher pressure. This step is addressed in FIG. 23 by (b1).

Still within the time span $T_{TR}$, the holder carrier 5 with at least one untreated substrate 3 is conveyed into the transfer vacuum chamber 23 through the gate valve 25 and by the conveyer 26, according to the embodiment of the FIGS. 7 and 8. The gate valve 25 is closed and the transfer vacuum chamber 23 is pumped down to the processing pressure $p_{TR}$. This step is shown in FIG. 23 by (b2).

After the treating the at least one substrate on one holder carrier 5 in the vacuum treatment chamber 15, this one holder carrier 5 with treated substrates 3 is replaced by the holder carrier 5 with untreated substrates 3 from the transfer vacuum chamber 23 through the gate valve 21 and—vice versa—, in the transfer vacuum chamber 23, the one holder carrier 5 with untreated substrates 3 is replaced by the holder carrier 5 with treated substrates 3 from the vacuum treatment chamber 15 through the gate valve 21. This step performed by the exchange conveyer 33 and is shown in FIG. 23 at (c).

These steps are repeated i.e., treating one holder carrier, during treating time exchanging a treated holder carrier by an untreated holder carrier in the transfer vacuum chamber 23, and after treating, exchanging the treated holder carrier in the vacuum treatment chamber 15 by an untreated holder carrier from the transfer vacuum chamber 23 and vice versa, exchanging an untreated holder carrier in the transfer vacuum chamber 23 by a treated holder carrier from the vacuum treatment chamber 15.

It becomes clear, that with the apparatus and the method according to the invention, the treatment process in the vacuum treatment chamber 15 is only interrupted for the exchange of HC 5 in step (c). The time span $T_{TR}$ available for processing the substrates in the vacuum treatment chamber 15 is not reduced by any pumping or venting time spans, as the process pressure is maintained in the vacuum treatment chamber 15 also during HC 5 exchange, step c).

This significantly improves the throughput of treated substrates.

With an eye on FIG. 23 one may see, that when appropriately tailoring the time spans for the steps (b1) and (b2) e.g. shortening these time spans for handling HC1 and handling HC3, the treated substrates on one HC may be exchanged by untreated substrates on the same HC, in ambient atmosphere AM. As e.g. HC1 reaches ambient atmosphere AM with treated substrates before HC3 leaves ambient atmosphere AM with untreated substrates, HC1 may be used as HC3 after exchange of treated substrates by untreated substrates.

Thus, and as realized today, performing unloading treated substrates from one of the holder carriers 5 and loading untreated substrates to one of the holder carriers 5 may be performed in ambient atmosphere and/or unloading treated substrates from one holder carrier and loading untreated substrates may be performed from and to the same holder carrier 5. Loading and unloading the substrates 3 in ambient atmosphere AM may be possibly preformed by hand but, as today practiced, by a robot as shown at 63 in FIG. 16.

With respect to the realization of the exchange conveyer 33 the following considerations prevail:

The swiveling radius R (see FIG. 7) of the outermost part of both HC5 passed through the gate valve 21 should be as small as possible to minimize the extent of the gate valve 21. That's why the two grasping arms 33a and 33b, by the extension drives 37a,37b, are retractable after having respectively grasped a HC 5 and are expandable to deposit the respective HC 5 on the respective HCS 11$_{TR}$, 11$_{LL}$. Additionally and to minimize the extent of the gate valve 21 the larger of the two minimum strokes—in retracted position—of the two grasping arms 33a, 33b should be as small as possible.

The grasping strokes of the two grasping arms 33a,33b might be equal for grasping/depositing a HC 5 from/on the HCS 11$_{LL}$ in the transfer vacuum chamber 23 and for grasping/depositing a HC 5 from/to the HCS 11$_{TR}$ in the vacuum process chamber 15. This necessitates highly accurate positioning of the HCS 11$_{LL}$ and of the HCS 11$_{TR}$ at equal distance from the rotation axis $A_{33}$ of the exchange conveyer 33. This might be hard to realize, also due to constructional tolerances, and is in fact not desired, because the HCS 11$_{LL}$ may be quite nearer to the rotation axis $A_{33}$ than the HCS 11$_{TR}$, former to minimize the volume of the vacuum transfer chamber 23, latter often given by the kind of process to be performed in the vacuum treatment chamber 15. Therefor the extensions/retractions of the grasping arms 33a,33b are, in one embodiment of the present invention, controlled by the extension drives 37a,37b mutually independently.

Most suited for fulfilling the requirements to the exchange conveyer 33 is an exchange conveyer with frog-leg-type grasping arms 33a,33b.

One example is schematically shown in FIG. 9. The exchange conveyer 33 comprises the two opposite grasping arms 33a and 33b realized as frog-leg-type arms with controlled electromotors 41 for controlling of the mutual angle of the frog-legs 39. The stroke of the grasping arms 33a and 33b may be individually controlled by appropriate control of electromotors 41. In FIG. 9 the prevailing position of the grasping arm 33a is the retracted position shown in rigid lines. The grasping arm 33a carries a HC 5 by means of the schematically shown grasping unit 35a. In dash lines the grasping arm 33a is shown in the extended position. To show independency of stroke control at the two grasping arms 35a and 35b those frog-legs 39 of the grasping arm 35b in prevailing position, i.e., in extended position are shown in solid lines, whereas the position of these legs 39 in retracted, minimal stroke position are drawn in dash line.

A second example which is used today in practicing the present invention is shown in the FIGS. 10a) to 10c). Here too, the exchange conveyer 33 may be said to comprise two grasping arms 35a and 35b in spite of the fact that the same frog-legs 39 are exploited for subsequently realizing one of the grasping arms and then the second grasping arm. This becomes apparent from FIG. 10.

In FIG. 10a) both grasping arms 33a, 33b (see also FIG. 10b)) may be said to be in minimal stroke position. Two pairs of frog-legs 39 are coupled via respective electromotors 41 to a reference blocks 43a and 43b which may be alternatively blocked in a stationary position with respect to the rotating part of the exchange conveyer 33. This is most schematically shown in FIG. 11 by mechanically connecting one or the other of the reference blocks 43 to a rotating part 45 of the exchange conveyer 33. The mechanical link is schematized by switch symbols at 47.

Back to the FIG. 10: For expanding the grasping arm 35a as shown in FIG. 10b the reference block 43a is blocked to the rotating part 45 of the exchange conveyer 33. According to the schematic representation of FIG. 11 the mechanical connection switch 47 is in righthand position. The grasping arm 33b is in retracted position. Inversely, for expanding the grasping arm 33b the reference block 47b is mechanically blocked to the rotating part 45 of the exchange conveyer 33.

With this type of exchange conveyer, which is most suited for realizing the present invention, one of the grasping arms 33a,33b may only then be expanded if the other grasping arm 33b or 33a is completely retracted. Such a conveyer, to be adapted to the specific needs for the present invention, is known as "bisymmetric" and is commercially available from the firm Brooks, vacuum robotics.

In the FIGS. 12 to 14 an embodiment of the grasping units 35a,35b is shown, as practiced today. Clearly other realization forms of the grasping units 35a,35b are possible, as perfectly clear to the skilled artisan, e.g. for magnetic grasping and releasing or by other types of mechanically grasping and releasing holder carriers HC 5.

FIGS. 12 and 13 respectively show schematically and simplified such a grasping unit 35a,35b for a HC 5, which HC 5 is, as an example, rectangular seen in top view (FIG. 13) and plane-plate shaped in cross-sectional view (FIG. 12).

Projections 49v and 49b are mounted to the HC 5 or are integral with the HC 5 and extend parallel to the extension plane PL 33 of the grasping arms 33a,33b of the exchange conveyer 33. The grasping units 35a,35b are realized by projecting grasping pins 51v and 51b aligned with bores 53v, 53b in the respective projections 49v,49b.

By extending and, respectively, retracting the grasping arms 33a,33b the grasping pins 51v,51b are simultaneously introduced into or respectively, simultaneously extracted from the bores 53v, 53b. There are provided three projections 49v and 49b, distributed along the periphery of the HC 5, as shown e.g., one 49v at the far end of the HC 5 considered in expansion direction of the grasping arm 33a or 33b and two at the near end of the HC 5, considered in the addressed direction. By providing a three-point grasping of the HC 5 a shown especially in FIG. 13, a stable and unambiguous positioning of the HC 5, once grasped, is achieved. For lifting a HC 5 from the HCS $11_{TR}$ or, respectively, from the HCS $11_{LL}$, and to deposit a HC 5 on the respective holding carrier support HCS $11_{TR}$ or HCS $11_{LL}$, either the exchange conveyer 33 may controllably lift and lower the grasping arms 33a, 33b in direction of the rotation axis $A_{33}$ as shown in FIG. 12 by the arrow W4 or the arrangement of all grasping pins 51v,51b may be controllably lifted and lowered relative to the grasping arms 33a,33b (not shown in the drawings). This is especially suited, if a commercially available conveyer per se does not provide the ability of lifting and lowering the grasping arms 33a,33b in direction of the rotation axis $A_{33}$ of the conveyer 33.

FIG. 14 shows a calotte shaped HC5 tailored to be grasped in complete analogy to the rectangular HC5 shown in the FIGS. 12 and 13. Please note that here the bores 53v and 53b may be directly provided in the HC5.

It is clear that, inversely to the representations in the FIGS. 12 to 14, the grasping pins 51v,51b or some of them may be mounted to the HC5, and the bores 53v,53b, or some of them, to the grasping units 35a,35b.

To ensure proper centering of the HS5 with respect to the grasping pins, the bores 53v,53b may be tapered as shown in FIG. 15.

As shown schematically in FIG. 16 the transfer vacuum chamber 23 may communicate with a series of one or more than one further vacuum chambers 55, equipped respectively with holder carrier supports 57 and exchange conveyers 59, constructed and handling the HS 5 at least similarly to the HCS $11_{LL}$ and the exchange conveyer 33. E.g. if processing time $T_{TR}$ in the vacuum treatment chamber 15 is too short, for venting and pumping the transfer vacuum chamber 23 and for exchanging the HC 5 through the gate valve 25 during that time $T_{TR}$, two or more transfer vacuum chambers 23 acting respectively as load locks, may be installed in series, as explained in the WO2019/219371 of the same applicant as the present application. The added vacuum chambers 55 may further be pretreatment chambers for the HC5, e.g. heating-, etching-, layer deposition- etc. chambers. Thereby it is to be noted that also in the transfer vacuum chamber 23, some pre-treatment on the HC 5, may be performed, e.g. pre-heating by means of heating lamps (not shown). In an embodiment as shown in FIG. 16 pre-treatment chambers 55 will normally be disabled, when a HC5 is returned with treated substrates towards ambient atmosphere through these chambers.

The input/output of HC 5 into and from the overall apparatus occurs thus either directly from ambient atmosphere AM through the gate valve 25 which then acts as input/output gate valve or from ambient atmosphere through a downstream gate valve as shown at ref.nr.61 in FIG. 16.

The HC 5 and the respective SH1 thereon are loaded with untreated substrates 3 and the treated substrates 3 are unloaded respectively in ambient atmosphere AM by hand or by a loading/unloading robot 63 as schematically shown in FIG. 16.

Because the loading/unloading robot 63 operates in ambient atmosphere, it may be tailored for highly complicated three-dimensional grasping and deposition operations on the substrates 3 relative to a HC 5.

In FIG. 17 a further possible structure of the apparatus according to the invention is shown. Because pre-treatments before treatment in the vacuum treatment chamber 15 may be different than post-treatments after the treatment in the vacuum treatment chamber 15, the HC 5 with substrates yet untreated in the vacuum treatment chamber 15 are conveyed from ambient via one or more than one pre-treatment chambers 551N to one gate valve 251N of the transfer vacuum chamber 23 and HC 5 having been treated in the vacuum treatment chamber 15 are conveyed via a gate valve $25_{OUT}$ and one or more than one post-treatment chambers $55_{OUT}$ to ambient atmosphere AM.

A further overall structure of an apparatus according to the present invention and which may be combined with one of the structures addressed in context with FIG. 16 or 17 is schematically shown in FIG. 18. Here the one transfer vacuum chamber 23 exchanges HC 5 with more than one vacuum treatment chamber 15, as represented in FIG. 18 with two such chambers 15A and 15B. Thereby it becomes possible to distribute a HC 5 input through gate valve 25 to one vacuum treatment chamber, e.g. 15A, then to distribute another HC5 to another vacuum treatment chamber, e.g. 15B, or to deliver one of the HC 5 to one vacuum treatment chamber, e.g. 15A, first and then to another vacuum treatment chamber, e.g. 15B, looping via the transfer vacuum chamber 23 and before such HC 5 leaves the transfer vacuum chamber 23 via the gate valve 25.

Up to now we have explained the apparatus and method according to the present invention wherein a complete holder carrier HC 5 is one-piece handled. Such HC 5 may be very large and heavy, as e.g. the calotte-shaped HC 5 for vacuum treatment chambers 15 performing evaporation coating of substrates on a calotte-shaped HC 5.

Therefore, and in one embodiment of the apparatus and of the method according to the invention as practiced today, the holder carrier HC 5 is subdivided in more than one holder carrier segments, $HC_{Se}$. The HC 5 with the carrier segments $HC_{Se}$ are handled like the HC 5 as described up to now. Exchange steps c) as addressed above are performed segment by segment. A segment may carry one, two or a multitude of substrate holders SH 1 and a segment may even be a dummy segment without a SH 1.

The holder carrier supports $11_{LL}$ and $11_{TR}$ are realized as frame structures on which the $HC_{Se}$ may be deposited and from which they may be removed by the exchange conveyer 33 with grasping arms 33a,33b, grasping units 35a,35b as was described for handling the complete, one piece HC 5.

The only generic difference between handling of one piece HC 5 and the handling of $HC_{Se}$-composed HC 5 is, that both holder carrier supports HCS $11_{LL}$ and $11_{TR}$, in the transfer vacuum chamber 23 and, respectively, in the vacuum treatment chamber 15, must be controllably rotatable stepwise around the respective axes $A_{11TR}$, $A_{11LL}$.

FIG. 19 shows, in a schematic and perspective view, a holder carrier sector $HC_{Se}$ 65 of a rectangular HC5 with a multitude of substrates 3. Features which have already been explained in context with the FIGS. 1 to 18 are addressed with the same reference numbers and only additionally explained, if differences have to be pointed out.

The holder carrier support HCS $11_{LL}$ and $11_{TR}$ are realized by a two-dimensional frame structure 67, on which the triangular, plane $HC_{Se}$ 65 are deposited and removed therefrom. Please note, that even if the addressed $HC_{Se}$ 65 of a rectangular HC 5 are not equal, for grasping and releasing the respective unequal $HC_{Se}$ 65 by the grasping pins $51v,51b$ and bores $53v,53b$ as were described above, there geometric arrangement may be equal for different $HC_{Se}$ 65. The HCS $11_{LL}$ and $11_{TR}$, both realized by the frame-structure 67, are both controllably stepwise rotatable around the respective axis $A_{11TR}$, $A_{11LL}$. Please note the rotational support step drive 69 drawn in dash lines in FIG. 8 for the HCS $11_{LL}$.

FIG. 24 shows schematically an embodiment of the apparatus according to the invention, operating with segmented HC 5.

Again, parts which have already been described are not anymore addressed and have the same reference numbers as in the figures discussed to now. For the exchange of untreated substrates with treated substrates through open gate valve 21 the segments 65 of HC 5 on the HCS $11_{TR}$ and $11_{LL}$, whereon the segments 65 of the respective HC 5 are supported are exchanged by the exchange conveyer 33, segment by segment.

To do so the HCS $11_{TR}$ and $11_{LL}$ are stepwise rotated around the respective axis $A_{11LL}$ and $A_{11TR}$ by an angle β which accords with the angular extent 13 of the segments 65 with respect to the axis $A_{HC}$. The stepwise rotation of the HCS $11_{TR}$ and $11_{LL}$ by the angle β is driven by one or two rotational drives 69.

The opening/closing of the gate valves 21 and 25, the operation of pump 29 to the transfer vacuum chamber 23, the operation of the exchange conveyer 33 and of conveyer 26, possibly besides of other operations of the overall apparatus according to the invention, are controlled by means of a timing unit 85 to commonly operate as was addressed above, e.g. in context with FIG. 23.

Please note that also if the HC 5 are of one piece as described above a timing unit 85 controls the common operation as addressed.

The HCS $11_{TR}$ may thus be differently rotated around the axis $A_{11TR}$ namely on one hand e.g. continuously for performing the treatment process, and, if the HC 5 are built up by segments 65, in steps. The HCS $11_{LL}$ is in fact only rotated in angular steps, if the HC 5 are built up by segments 65 and is otherwise stationary.

FIG. 20 shows a $HC_{Se}$ 65 for a calotte-shaped HC 5 and the respective frame-structure 73 of the HCS $11_{LL}$ and $11_{TR}$ in a schematic, perspective view. Again, features which have already been explained are addressed with the same reference numbers and only additionally explained, if differences have to be pointed out.

FIGS. 21*a*) and 21*b*), respectively, show schematically and simplified an embodiment of the grasping units 35*a*,35*b* for calotte-segments $HC_{Se}$ 65, in side (FIG. 21*a*) and in top view (FIG. 21*b*) and in functional analogy to the grasping units 35*a* and 35*b* shown in FIGS. 12 and 13 for one piece HC 5 handling. A center arm 52 also shown in FIGS. 12 and 13 is in this embodiment, bent, following the outside shape of the $HC_{Se}$ 65 and carries the grasping pin 51*v*. Lateral arms 54 are as well shaped according to the outer shape of the $HC_{Se}$ 65 and respectively carry the grasping pins 51*b*.

FIG. 22 shows, schematically, an embodiment of the apparatus according to the invention and performing the method according to the invention, as practiced today.

According to FIG. 22 the vacuum treatment chamber 15 is an evaporation-coating chamber. The holder carrier support HCS $11_{TR}$ is realized as a frame structure 73 as schematically shown in FIG. 20, whereon the $HC_{Se}$ 65, as also shown in FIG. 20, may be applied and removed. The calotte-frame structured HCS $11_{TR}$ is controllably rotatable—$W_{11TR}$—around the center axis $A_{HC}$ which coincides with the rotation $A_{11TR}$ axis which is vertically directed. An evaporation source 75, e.g. an electron beam- or a thermal-evaporation source, is centered vertically bellow the HCS $11_{TR}$. Thus, the extended surfaces 7 of the substrates (not shown) are freely exposed to the evaporation source 75 along the lower extended surface of the holder carrier HC 5, which is realized by or composed from the distinct $HC_{Se}$ 65 shown in FIG. 20. The vacuum treatment chamber 15, here the evaporation chamber, communicates via the gate valve 21 with the transfer vacuum chamber 23.

The holder carrier 5, composed of the distinct calotte-segments 65 is conveyed into and removed from the transfer vacuum chamber 23 via the gate valve 25. The HCS $11_{LL}$ is controllably stepwise rotatable—$W_{11LL}$—around the vertical center axis $A_{HC}$ axis which coincides with the rotation axis $A_{11LL}$. Substrates 3 from a holder carrier 5 with treated substrates 3 and output via gate valve 25, are unloaded from the holder carrier 5 and thus from the segments 65 thereof, and are replaced by untreated substrates 3 in ambient atmosphere AM. This is performed by the loading/unloading robot 63 handling substrates between a set of cassettes 77 and the HC 5.

As shown in dash lines in FIG. 22 loading and unloading of the $HC_{Se}$ 65 and thus of the HC 5 is performed below the transfer vacuum chamber 23. The HCS $11_{LL}$ with the HC 5 and thus the $HC_{Se}$ 65 with the untreated substrates 3 is lowered—$W79$—out of the transfer vacuum chamber 23 via the gate valve 25 and the HC 5 with the exchanged, untreated substrates 3 is lifted into the transfer vacuum chamber 23 by means of a vertical movement drive 79 with a rod 83.

The gate valve 25 is realized by a valve plate 81 which is mounted horizontally with respect to the rod 83 i.e. parallel to the outer surface of the bottom wall of the transfer vacuum chamber 23.

In uppermost position, the valve plate 81 seals the transfer vacuum chamber as schematically shown by seal 84.

The exchange conveyer 33 exchanges $HC_{Se}$ 65 between the HCS $11_{TR}$ and the $HCS_{LL}$ which is in the upper position, as shown in solid lines. The exchange conveyer 33 is realized by a conveyer type as was presented which the help of the FIGS. 10 and 11 and the grasping units are realized as schematically shown and explained with the help of FIG. 21.

The operation of the apparatus is as follows and accords with the sequence shown in and explained in context with FIG. 23: The exchange step (c) as shown in FIG. 23 is performed as follows:

a) Swiveling the retracted grasping arms 33*a* and 33*b* in retracted position as shown in FIG. 10*a* in alignment with both axes $A_{11LL}$ and $A_{11TR}$.

b) Expanding, e.g. the grasping arm 33*a* (see FIG. 10*b*), and grasping by means of the grasping unit 35*a*, realized as shown in FIG. 21, one $HC_{Se}$ 65 from the HCS $11_{TR}$, realized as shown in FIG. 20 and with treated i.e. evaporation coated substrates 3.

Slightly lifting the grasping unit 35*a* in direction of the axes $A_{11TR}$ and retracting the grasping arm 33*a*(FIG. 10*a*).

Expanding the grasping arm 33*b* (FIG. 10*c*) and grasping by means of the grasping unit 35*b*, realized as shown in FIG. 21, one $HC_{Se}$ 65 from the HCS $11_{LL}$, realized as shown in FIG. 20 and with untreated substrates 3. Slightly lifting the grasping unit 35$b$ in direction of the axes $A_{11LL}$ and retracting the grasping arm 33$b$(FIG. 10$a$).

c) Swiveling the grasping arms 33$a$, 33$b$ around the rotation axes $A_{33}$ by 180° in inversely aligned position with both axes $A_{11LL}$ and $A_{11TR}$.

d) Expanding one of the grasping arms e.g. 33$a$ and slightly lowering the grasping arm in direction of the axis $A_{33}$, releasing the grasping pins 51$v$,51$b$ from the bores 53$v$,53$b$ thereby depositing the EC$_{Se}$ 65 with treated substrates 3 on the HCS 11$_{LL}$. Retracting the now emptied grasping arm 33$a$.

e) Expanding the grasping arm 33$b$ and slightly lowering the grasping arm in direction of the axis $A_{33}$, releasing the grasping pins 51$v$,51$b$ from the bores 53$v$,53$b$ thereby depositing the EC$_{Se}$ 65 with untreated substrates 3 on the HCS 11$_{TR}$. Retracting the now emptied grasping arm 33$b$.

f) Rotating the HCS 11$_{TR}$ and the HCS 11$_{LL}$ by the angular step of the extent β and g) Repeating steps a) to f) up to having exchanged all the HC$_{Se}$ 65 carrying treated substrates 3 on the HCS 11$_{TR}$ in the vacuum treatment chamber 15 by HC$_{Se}$ 65 carrying untreated substrates 3 from the transfer vacuum chamber 23 and inversely at the HCS 11$_{LL}$.

Further:

During the evaporation processing in the vacuum treatment chamber 15, the HC 5 with treated substrates is conveyed from the transfer vacuum chamber 23 to ambient atmosphere, is unloaded, then reloaded with untreated substrates and conveyed into the transfer vacuum chamber 23, ready for exchange with the HC5 with treated substrates from vacuum treatment chamber 15.

The vacuum treatment chamber 15 is not vented up to termination of treatment of all substrates as required.

The HC$_{Se}$ 65 need not carry the same number of SH 1. It is possible, e.g. for small substrate batches, to introduce dummy HC$_{Se}$ 71, i.e., without SH 1, or to provide a HC 5 just with one HC$_{Se}$ 65 on a part of the respective HCS leaving an other part free of a HC$_{Se}$ 65, or to provide just two HC$_{Se}$ 65, e.g. each carrying one large substrate etc.

What is claimed is:

1. A vacuum treatment apparatus comprising:

at least one substrate holder located along an extended surface of at least one holder carrier, said substrate holder being configured to hold an extended surface of a substrate resting therein to be freely exposed to the surrounding along said extended surface of said holder carrier, said extended surface of said holder carrier extending around a central axis of said holder carrier directed traverse to said extended surface of said holder carrier;

at least one vacuum treatment chamber communicating via one first gate valve with a transfer vacuum chamber;

said vacuum treatment chamber comprising a first holder carrier support configured to support one holder carrier;

said transfer vacuum chamber comprising:

a pumping port;

a second holder carrier support configured to support one holder carrier;

an exchange conveyer between said first gate valve and said second holder carrier support, configured to grasp and release a holder carrier from and, respectively, on said first holder carrier support, through said first gate valve, and to grasp and release a holder carrier from and, respectively, on said second holder carrier support;

at least one second gate valve communicating towards ambient atmosphere;

a further conveyer configured to convey a holder carrier through said at least one second gate valve from and/or onto said second holder carrier support.

2. The vacuum treatment apparatus according to claim 1, wherein said distinct holder carrier comprises at least two distinct segments, and said exchange conveyer is configured to grasp and release one of said distinct segments at a time from and, respectively, on said first holder carrier support, and to grasp and release one of said distinct segments at a time from and, respectively, on said second holder carrier support.

3. The vacuum treatment apparatus according to claim 2, wherein said first carrier support comprises a frame supporting structure for said distinct segments.

4. The vacuum treatment apparatus of claim 1, wherein said extended surface of said holder carrier is one of plane, convex or concave.

5. The vacuum treatment apparatus of claim 1, wherein said extended surface of said holder carrier is concave and calotte-shaped.

6. The vacuum treatment apparatus of claim 1, wherein said extended surface of said holder carrier is concave or convex and formed by sectors of plane surfaces.

7. The vacuum treatment apparatus of claim 1, wherein said first holder carrier support is controllably rotatable around the support central axis.

8. The vacuum treatment apparatus of claim 1, wherein said distinct holder carrier comprises at least two distinct segments, and said exchange conveyer is configured to grasp and release one of said distinct segments at a time from and, respectively, on said first holder carrier support, and to grasp and release one of said distinct segments at a time from and, respectively, on said second holder carrier support, and said first and said second holder carrier supports are rotatable around a respective holder central axis in angular steps by at least one step drive.

9. The vacuum treatment apparatus according to claim 1, wherein each of said first and second holder carrier supports has a holder central axis; and said holder central axes are mutually parallel.

10. The vacuum treatment apparatus of claim 9, wherein said central axis of one of said holder carrier on said first holder carrier support and said central axis of one of said holder carrier on said second holder carrier support coincide respectively with said support central axes.

11. The vacuum treatment apparatus according to claim 1, wherein said central axis of one of said holder carrier on said first holder carrier support and said central axis of one of said holder carrier on said second holder carrier support are mutually parallel.

12. The vacuum treatment apparatus according to claim 11, wherein said exchange conveyer is configured to convey said holder carrier perpendicularly to said central axes of said holder carriers on said first and on said second holder carrier supports.

13. The vacuum treatment apparatus of claim 1, said exchange conveyer comprising at least two extendable and retractable grasping arms relative to a rotation axis of said exchange conveyer and commonly and controllably rotatable around said rotation axis by means of a rotation drive, each of said grasping arms comprising a grasping unit configured to controllably grasp and release a holder carrier.

14. The vacuum treatment apparatus of claim 13 wherein said central axis of one of said holder carrier on said first holder carrier support and said central axis of one of said holder carrier on said second holder carrier support and said rotation axis are mutually parallel.

15. The vacuum treatment apparatus of claim 13, said grasping units grasping and releasing said holder carriers or said segments of said holder carriers by pin and bore or slots links.

16. The vacuum treatment apparatus of claim 1, wherein said second gate valve is in a bottom wall of said transfer vacuum chamber, said further conveyer comprising a controllably driven elevator, drivingly movable towards and from said bottom wall and carrying a valve plate oriented parallel to said bottom wall, said valve plate sealing said transfer vacuum chamber as said elevator is in a position nearest to said bottom wall.

17. The vacuum treatment apparatus of claim 1, comprising at least two of said second gate valve and said further conveyer is configured to convey a holder carrier through one of said at least two second gate valves from said second holder carrier support and to convey a holder carrier through another of said at least two second gate valves onto said second holder carrier support.

18. The vacuum treatment apparatus of claim 1, wherein said further conveyer is configured to convey a holder carrier forth and back through one of said at least one second gate valves from and onto said second holder carrier support.

19. The vacuum treatment apparatus of claim 1, said exchange conveyer comprising at least two expandable and retractable grasping arms expandable and retractable relative to a rotation axis of said exchange conveyer and commonly and controllably rotatable around said rotation axis by means of a rotation drive, said grasping arms having a stroke to grasp and, respectively, release a holder carrier from and on said first holder carrier support through said first gate valve, and to grasp and, respectively, release a holder carrier from and on said second holder carrier support.

20. The vacuum treatment apparatus according to claim 1, comprising a loading/unloading conveyer in ambient atmosphere, configured to load and unload a substrate on and from said at least one substrate holder in ambient atmosphere.

21. The vacuum treatment apparatus according to claim 1, comprising a timing unit controlling at least operation of said further conveyer and of said second gate valve and being configured to control operation of said further conveyer to exchange a holder carrier on said second holder carrier support during treatment-operation of said vacuum treatment chamber.

22. The vacuum treatment apparatus of claim 1, wherein:
a) said vacuum treatment chamber is an evaporation coating chamber and comprises at least one evaporator source;
b) said holder carrier comprises at least two distinct segments and is calotte-shaped;

c) said first and second holder carrier supports are calotte-frame shaped and are controllably rotatable around a respective axis.

23. A holder carrier adapted to be used in an apparatus according to claim 1, which is constructed to hold the extended surfaces of at least two substrates applied thereto to be freely exposed to the surrounding along an extended surface of said holder carrier, said extended surface of said holder carrier extending around a central axis directed traverse to said extended surface of said holder carrier, said holder carrier comprising at least two distinct segments which may be assembled to result in said holder carrier and disassembled.

24. A method of manufacturing vacuum treated substrates comprising:
providing more than one holder carriers, each of said holder carriers comprising an extended surface and at least one substrate holder along said extended surface, said at least one substrate holder being constructed to hold an extended surface of a substrate resting therein to be freely exposed to the surrounding along said extended surface of said holder carrier, said extended surface of said holder carrier extending around a central axis of said holder carrier directed traverse to said extended surface of said holder carrier;
providing at least one vacuum treatment chamber constructed to treat the at least one substrate on a single of said holder carriers;
providing a transfer vacuum chamber connected via a gate valve to said at least one vacuum treatment chamber; and
performing the further steps of:
a) treating the substrate on one of said holder carriers at a time in said vacuum treatment chamber, resulting in a treated substrate on said one holder carrier thereby performing said treatment at a process pressure in said vacuum treatment chamber, said treatment lasting during a treatment time span;
b) during said treating time span;
b1): conveying one of said holder carriers with previously treated substrates from said transfer vacuum chamber towards ambient thereby venting said transfer vacuum chamber, and
b2): conveying one of said holder carriers with untreated substrates from ambient into said transfer vacuum chamber and establishing process pressure in said transfer vacuum chamber;
c) after said treatment, exchanging in said vacuum treatment chamber said one holder carrier with treated substrates by said holder carrier with untreated substrates from said transfer vacuum chamber through said gate valve and exchanging in said transfer vacuum chamber said one holder carrier with untreated substrates by said holder carrier with treated substrates from said vacuum treatment chamber through said gate valve; and
d) repeating steps a) to c).

* * * * *